United States Patent
Xu et al.

(10) Patent No.: US 11,694,901 B2
(45) Date of Patent: Jul. 4, 2023

(54) FIELD-EFFECT TRANSISTOR AND METHOD FOR MANUFACTURING THE SAME

(71) Applicant: Shanghai Industrial μTechnology Research Institute, Shanghai (CN)

(72) Inventors: Qiuxia Xu, Shanghai (CN); Kai Chen, Shanghai (CN)

(73) Assignee: Shanghai Industrial μTechnology Research Institute, Shanghai (CN)

( * ) Notice: Subject to any disclaimer, the term of this patent is extended or adjusted under 35 U.S.C. 154(b) by 18 days.

(21) Appl. No.: 17/371,142

(22) Filed: Jul. 9, 2021

(65) Prior Publication Data

US 2021/0343544 A1 Nov. 4, 2021

Related U.S. Application Data

(63) Continuation of application No. 16/822,175, filed on Mar. 18, 2020, now Pat. No. 11,217,694.

(30) Foreign Application Priority Data

| Mar. 18, 2019 | (CN) | 201910202715.8 |
| Mar. 18, 2019 | (CN) | 201910202716.2 |
| Mar. 18, 2019 | (CN) | 201910202930.8 |

(51) Int. Cl.
*H01L 21/3065* (2006.01)
*H01L 21/3213* (2006.01)
(Continued)

(52) U.S. Cl.
CPC .. *H01L 21/30655* (2013.01); *H01L 21/02603* (2013.01); *H01L 21/28238* (2013.01);
(Continued)

(58) Field of Classification Search
CPC ..... H01L 21/823431; H01L 21/823437; H01L 21/823462; H01L 21/823821;
(Continued)

(56) References Cited

U.S. PATENT DOCUMENTS

| 7,002,207 B2 * | 2/2006 | Kim | H01L 29/78654 257/E21.409 |
| 7,374,986 B2 * | 5/2008 | Kim | H01L 29/78696 438/129 |

(Continued)

*Primary Examiner* — Eduardo A Rodela

(57) ABSTRACT

Disclosed is a field-effect transistor and a method for manufacturing a field-effect transistor. The method comprises: forming an NMOSFET region and a PMOSFET region on a substrate; forming a hard mask on the NMOSFET region and the PMOSFET region, and patterning through the hard mask; forming a multiple of stacked nanowires in the NMOSFET region and a multiple of stacked nanowires in the PMOSFET region; forming a first array of nanowires in the NMOSFET region and a second array of nanowires in the PMOSFET region; and forming an interfacial oxide layer, a ferroelectric layer, and a stacked metal gate in sequence around each of the nanowires included in the first array and the second array. Wherein the NMOSFET region and the PMOSFET region are separated by shallow trench isolation.

28 Claims, 10 Drawing Sheets

(51) Int. Cl.
  *H01L 29/49*   (2006.01)
  *H01L 21/02*   (2006.01)
  *H01L 29/78*   (2006.01)
  *H01L 21/28*   (2006.01)
  *H01L 29/06*   (2006.01)
  *H01L 29/423*  (2006.01)

(52) U.S. Cl.
  CPC .... *H01L 21/32139* (2013.01); *H01L 29/0669* (2013.01); *H01L 29/42372* (2013.01); *H01L 29/42392* (2013.01); *H01L 29/49* (2013.01); *H01L 29/78391* (2014.09)

(58) Field of Classification Search
  CPC ....... H01L 21/823828; H01L 21/82385; H01L 21/823857; H01L 29/78391; H01L 21/02603; H01L 21/28238; H01L 21/30655; H01L 21/32139; H01L 29/0669; H01L 29/49; H01L 29/42392
  See application file for complete search history.

(56) References Cited

U.S. PATENT DOCUMENTS

| | | | |
|---|---|---|---|
| 7,608,893 B2 * | 10/2009 | Orlowski | H01L 29/42392 |
| | | | 257/351 |
| 8,129,247 B2 * | 3/2012 | Bangsaruntip | B82Y 10/00 |
| | | | 438/300 |
| 8,969,148 B2 * | 3/2015 | Vinet | H01L 29/413 |
| | | | 977/938 |
| 9,252,058 B2 * | 2/2016 | Hong | H01L 21/823431 |
| 9,634,091 B2 * | 4/2017 | Ching | H01L 21/823807 |
| 10,243,040 B1 * | 3/2019 | Park | H01L 29/0673 |
| 10,720,503 B2 * | 7/2020 | Ching | H01L 29/78696 |
| 10,872,825 B2 * | 12/2020 | Chiang | H01L 29/0649 |
| 11,031,397 B2 * | 6/2021 | Liaw | H01L 29/785 |
| 11,302,692 B2 * | 4/2022 | Lin | H01L 29/66795 |
| 11,335,809 B2 * | 5/2022 | Chiang | H01L 29/78618 |
| 2013/0105897 A1 * | 5/2013 | Bangsaruntip | H01L 29/78696 |
| | | | 257/E21.632 |
| 2016/0087600 A1 * | 3/2016 | Alaca | H03H 9/2463 |
| | | | 977/956 |
| 2020/0135475 A1 * | 4/2020 | Cheng | H01L 21/823842 |
| 2021/0134950 A1 * | 5/2021 | Hsu | H01L 21/823462 |
| 2022/0328621 A1 * | 10/2022 | Kuan | H01L 29/0649 |

* cited by examiner

FIELD-EFFECT TRANSISTOR AND METHOD FOR MANUFACTURING THE SAME

CROSS-REFERENCE TO RELATED APPLICATION

This application is a divisional application claiming priority to U.S. application Ser. No. 16/822,175, filed on Mar. 18, 2020, which claims the priority to Chinese Patent Application No. 201910202715.8, No. 201910202930.8, No. 201910202716.2, filed on Mar. 18, 2019, entitled "field-effect transistor and method for manufacturing the same", which are incorporated herein by reference in its entirety.

BACKGROUND OF THE DISCLOSURE

Field of the Disclosure

The present disclosure relates to a technical field of semiconductor technology, and more particularly, to a transistor and a method for manufacturing a transistor.

Description of the Related Art

The mainstream process of MOSFET at present uses a fully gate-last integration process, which has requirements and limitations on the thickness of each layer. For different technology nodes, widths (corresponding to gate lengths) of gate trenches are different, and a different width of gate trench requires a different thickness of the ferroelectric layer. With the decreasing of dimension in technology nodes, the width of gate trench is required to be smaller, so that the thickness of the ferroelectric layer shall be thinner.

Therefore, it is necessary to propose a ferroelectric negative capacitance transistor that adopting gate-all-around process, which is easy to for integrating, compatible with CMOS technology, and a manufacturing method thereof.

SUMMARY OF THE DISCLOSURE

This present invention discloses a method of fabricating transistor, the method comprising: forming an NMOSFET region and a PMOSFET region on a substrate, wherein the NMOSFET region and the PMOSFET region are separated by shallow trench isolation; and forming a hard mask on the NMOSFET region and PMOSFET region, and patterning; and forming a multiple of stacked nanowires in the NMOSFET region and a multiple of stacked nanowires in the PMOSFET region; and forming a first array of nanowires in the NMOSFET region and a second array of nanowires in the PMOSFET region; and forming an interfacial oxide layer, a ferroelectric layer, and a stacked metal gate in sequence around each of the nanowires included in the first array and the second array.

This present invention discloses another method of fabricating transistor, comprising: forming a MOSFET region on a substrate; and forming a hard mask on the MOSFET region and patterning; and forming a multiple of stacked nanowires within MOSFET; and forming an array of nanowires in the MOSFET region; and forming an interfacial oxide layer, a ferroelectric layer, and a stacked metal gate in sequence around each of the nanowires within the array.

This present invention discloses a transistor, comprising: a substrate; and an NMOSFET region and a PMOSFET region, wherein the NMOSFET region and the PMOSFET region are separated by shallow trench isolation; and a first array of nanowires in NMOSFET region and a second array of nanowires in PMOSFET region; and an interfacial oxide layer, a ferroelectric layer, and a stacked metal gate formed in sequence around each of the nanowires included in the first array and the second array; and a source region and a drain region within the NMOSFET region are at the two sides of the first array of nanowires, and a source region and a drain region within the PMOSFET region are at the two sides of the second array of nanowires.

This present invention discloses another transistor, comprising: a substrate; and a MOSFET region formed on the substrate; an array of nanowires in the MOSFET region; an interfacial oxide layer, a ferroelectric layer, and a stacked metal gate formed in sequence around each of the nanowires included in the array; and a source region and a drain region which are at the two sides of the first array of nanowires.

Preferably, a thickness of the interfacial oxide layer is between 0.5 nm and 1.5 nm, a thickness of the ferroelectric layer is between 1 nm and 10 nm, and a thickness of the stacked metal gate is between 1 nm and 10 nm.

Preferably, the ferroelectric layer can be a doped Hf-based oxide, the doped Hf-based oxide can be one or more of HfZrO, HfZrAlO, HfAlO, HfSiO, HfLaO, HfSrO, HfGdO and HfYO, and the corresponding ratio of doping element Zr, Si, Y, Al, Gd, Sr and La is between 30-60%, 3-6%, 4-6.5%, 3.5-6.5%, 1.5-4%, 8-12% and 2-5%.

The transistor and its manufacturing method of each embodiment is fully compatible with the traditional CMOS process, which process is simpler and with lower cost.

Figure 1:
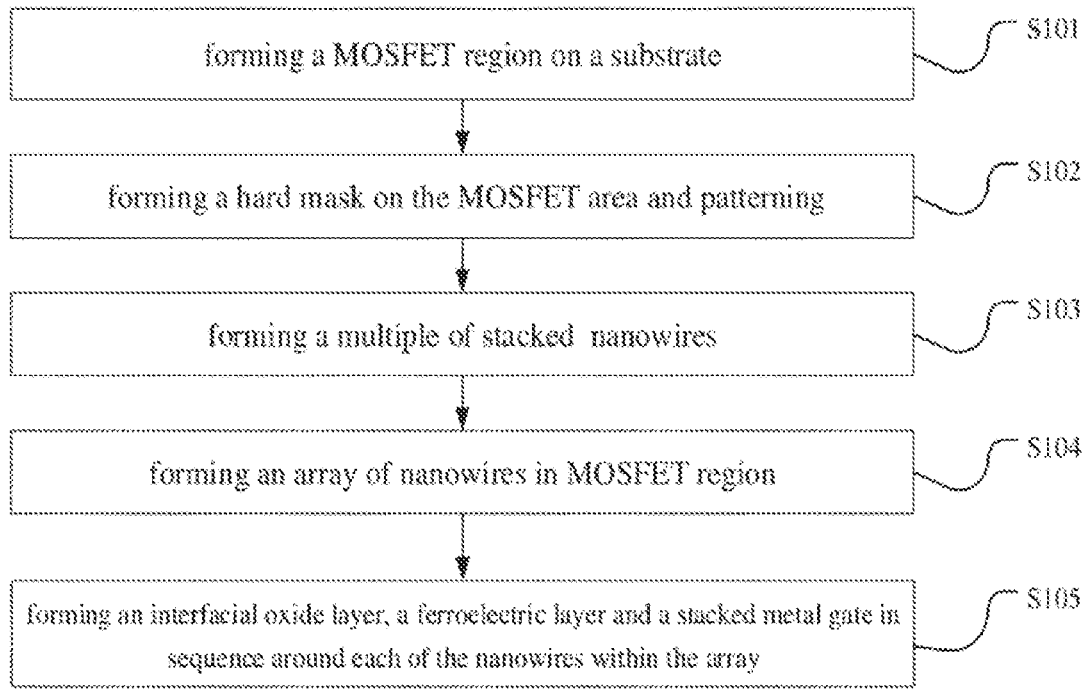
FIG. 1 is a flow chart of a method for fabricating a transistor according to an embodiment of the present disclosure.

10, 10'—substrate; 20, 20'—shallow trench isolation;
30, 30'—hard mask;
31, 31'—PE SiO2; 32, 32'—α-Si;
40, 40'—stacked nanowires;
41, 41',42, 42'—array of nanowires;
50, 50'—sacrificial oxide layer;
60, 60', 60"—dummy gate stack;
61, 61', 61"—dummy gate dielectric; 62, 62', 62"—dummy gate conductor;
70, 70'—gate sidewall; 80, 80'—interlayer dielectric layer;
81, 81' 83, 83'—source region; 82, 82', 84, 84'—drain region;
91, 91', 91"—interfacial oxide layer; 92, 92', 92"—ferroelectric layer;
93, 93', 93"—first metal gate; 94, 94', 94"—second metal gate.

DETAILED DESCRIPTION

The present disclosure is to provide a negative capacitance field-effect transistor, and to provide a method for fabricating the same. In one embodiment, the transistor has an NMOSFET region and PMOSFET region, the NMOSFET region includes a first array of nanowires which can achieve a good electron mobility performance of NMOSFET, PMOSFET region includes a second array of nanowires which can improve the hole mobility of PMOSFET. Moreover, the structure of gate-all-around nanowires greatly improves gate control capability and excellently suppresses short-channel effects. In particular, a ferroelectric negative capacitance effect is introduced into the transistor which adopts gate-all-around process of the present disclosure, effectively increasing a surface potential of the channel of the transistor to be greater than an applied gate voltage, thereby achieving voltage amplification, breaking the Boltzmann limit of the subthreshold swing, achieving ultra-steep subthreshold swing and higher on/off current ratio, and meeting the requirements of high-performance integrated circuits. Therefore, integrating the ferroelectric negative capacitance effect into the transistor with gate-all-around process is an optimal choice of great benefit, which makes it possible to be integrated in the advanced process such as 3 or 2 nanometers. Moreover, the above-described transistor with the negative capacitance is fully compatible with the traditional industry CMOS process, can be manufactured with simple processes, low cost, and has an excellent industrial application prospect.

In order to make the objects, technical solutions and advantages of the present disclosure more clear, exemplary embodiments of the present disclosure will be described in more details below with reference to the accompanying drawings.

In the present disclosure, the term "semiconductor device structure" refers to a substrate 10, 10' and all layers or regions formed on the substrate 10, after various steps of fabricating the semiconductor device are performed. The term "P-type dopant ion" refers to a dopant ion which is used in a PMOSFET and can increase effective work function. The term "N-type dopant ion" refers to a dopant ion which is used in an NMOSFET and can reduce the effective work function. The term "between" indicates that two endpoint values are included. In the following description, similar components are denoted by same or similar reference numerals, whether or not they are shown in different embodiments. For the sake of clarity, the figures are not drawn to scale in the various figures. Conventional structures or configurations will be omitted when it may cause confusion to the understanding of the present disclosure. Further, shapes and sizes of the components in the drawings do not reflect a true size and proportion, but merely illustrate the contents of the embodiments of the present disclosure. The fillers in gate openings of FIG. 3C and FIG. 3D denoted by a same fill mark indicate a same structure. The fillers in gate openings of FIG. 4C and FIG. 4D denoted by a same fill mark indicate a same structure.

It should be noted that the semiconductor structures are all illustrated in a cross-sectional view in the drawings, and the cross-section refers to the cross-section of the nanowires.

In an exemplary embodiment of the present disclosure, a negative capacitance gate-all-around field-effect transistor and a method for manufacturing the same are provided.

FIG. 1 is a flow chart of a method of fabricating a gate-all-around field-effect transistor with stacked nanowire array having a negative capacitance effect disclosed in the present patent application. A method for manufacturing a negative capacitance gate-all-around field-effect transistor with stacked nanowire array is provided and comprises: forming a MOSFET region on a substrate; and forming a hard mask on the MOSFET region and patterning through the hard mask; and forming stacked nanowires; and forming an array of nanowires in MOSFET region; and an interfacial oxide, a ferroelectric layer, and a metal gate stack are sequentially formed around each of the nanowires within the nanowire array.

Referring to FIG. 1, the method for manufacturing the gate-all-around field-effect transistor with negative capacitance in accordance of the present disclosure comprises the following steps.

Figure 3A:
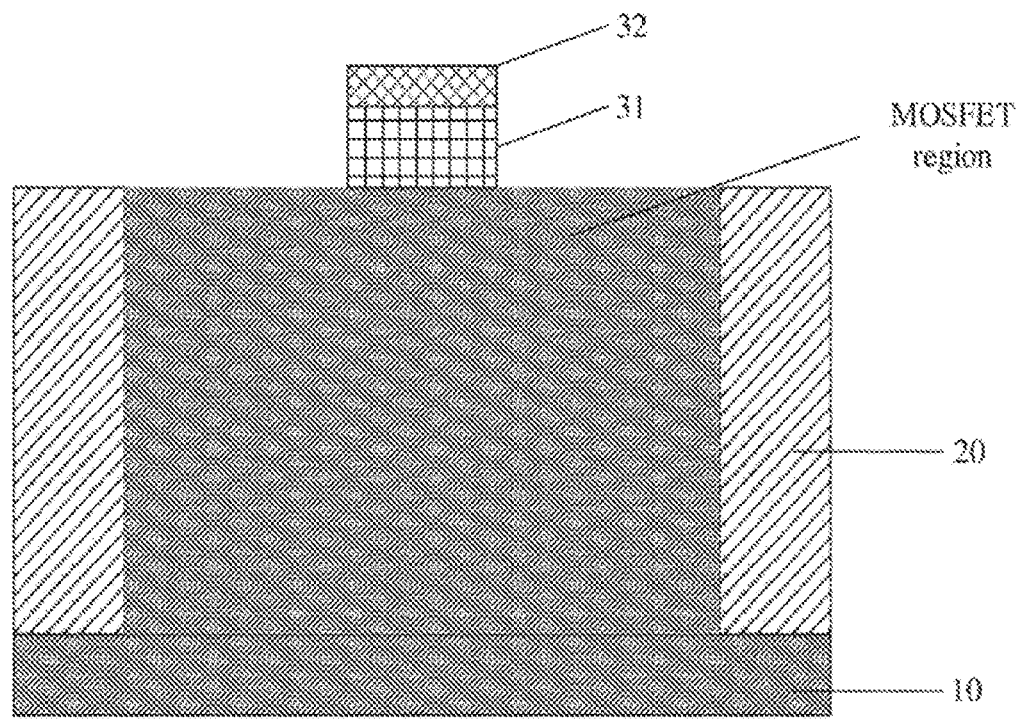
FIG. 3A to 3E are cross-sectional views illustrating various steps of a method for manufacturing the field-effect transistor according to an embodiment of the present disclosure.

In step S101, forming a MOSFET region on a substrate. Referring to FIG. 3A, the MOSFET region is formed on the substrate 10, the MOSFET region is surrounded by a shallow trench isolation 20. According to the present disclosure, the substrate 10 is a normal semiconductor substrate, which may be a silicon substrate, an SOI substrate, or the other semiconductor substrate.

In step S102, forming a hard mask on the MOSFET region and patterning through the hard mask. There are various methods for depositing the hard mask, such as LPCVD, PECVD, ALD, MOCVD, PVD or furnace tube thermal oxidation. For example, a patterning method includes lithography process and etching process, wherein the lithography process includes optical exposure, electron beam exposure, nanoimprinting process, focused ion deposition and so on. The etching process includes plasma etching, reactive ion etching, and ion beam etching. In one embodiment, a method of forming the hard mask and patterning comprising: sequentially depositing a SiO2 layer 31 by PECVD and an α-Si layer 32 by LPCVD on the MOSFET region, as shown in FIG. 3A; coating photoresist on the α-Si layer 32 and performing electron beam exposure; forming a hard mask comprising the SiO2 layer 31 and the α-Si layer 32 with a nanowire pattern by reactive ion etching, as shown in FIG. 3A. The SiO2 layer 31 and the α-Si layer 32 are the cross-sectional view of the hard mask with a nanowire pattern.

In step 103, forming a multiple of stacked nanowires. In one embodiment, as an example, the material of the stacked nanowires is silicon, the stacked nanowires is formed by repeated alternating anisotropic and isotropic plasma etching in the MOSFET region, and after each step of etching, the surface of each of the exposed Si nanowires is oxidized by plasma to form a passivation film, so that the silicon nanowires which have been formed can be prevented from being damaged in a subsequent etching step. The passivation film on the surface of the Si substrate in the MOSFET region is removed by CF4 anisotropic plasma to facilitate the subsequent etching.

The etching power, gas composition, etching time and other parameters can be determined according to the requirements of the size and shape of the nanowires. In one embodiment, the anisotropic plasma etching gas for the anisotropic plasma etching can be one or more of HBr, Cl2, O2, He, and an energy of the anisotropic plasma etching is between 150 W and 500 W; the isotropic plasma etching gas for the isotropic plasma etching can be one or more of SF6, He, and an energy of the isotropic plasma etching is between 200 W and 800 W. For example, the anisotropic plasma gas can be HBr and Cl2, or can be HBr, Cl2 and O2, wherein the ratio of Cl2:HBr is between 1:1 and 1:5, and the additive is O2; the isotropic plasma gas can be SF6 and He, wherein the ratio of SF6:He is between 1:3 and 1:20.

Figure 3B:
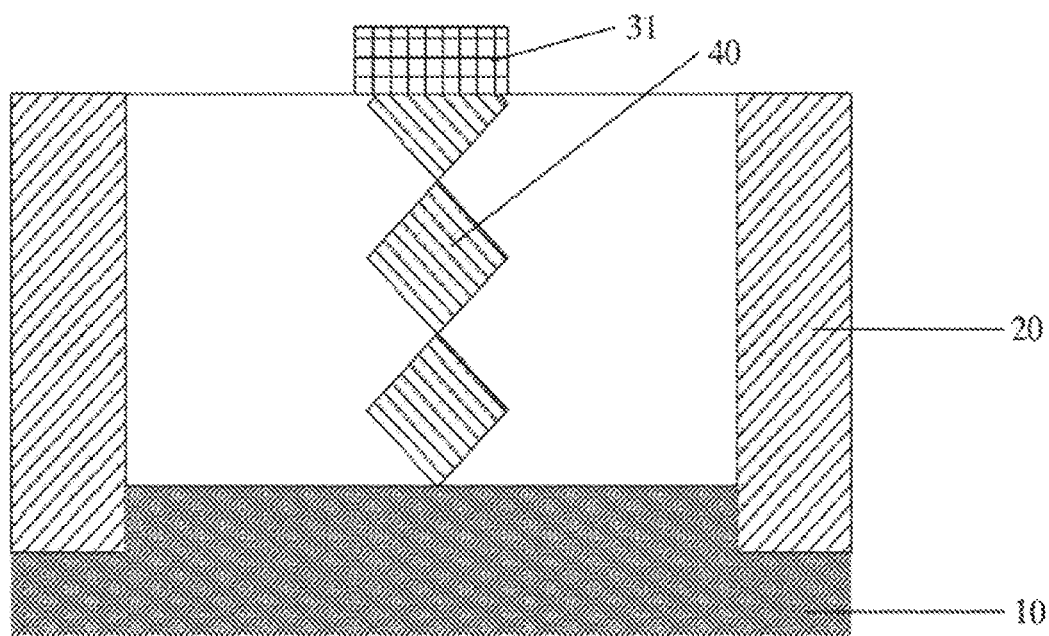

In one embodiment, the number of nanowires may be more than one, for example, as shown in FIG. 3B, three stacked nanowires 40 are formed in the MOSFET region, three stacked nanowires is only described as an example according to the present disclosure, but the number of the stacked nanowires is not limited in the present disclosure.

Figure 1A:
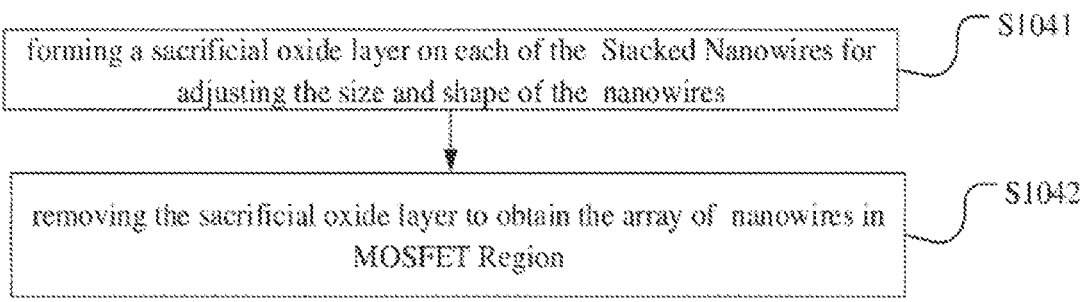
FIG. 1A is a flow chart of a method for forming the array of nanowires in accordance with the embodiment as described in FIG. 1.
Figure 3C:
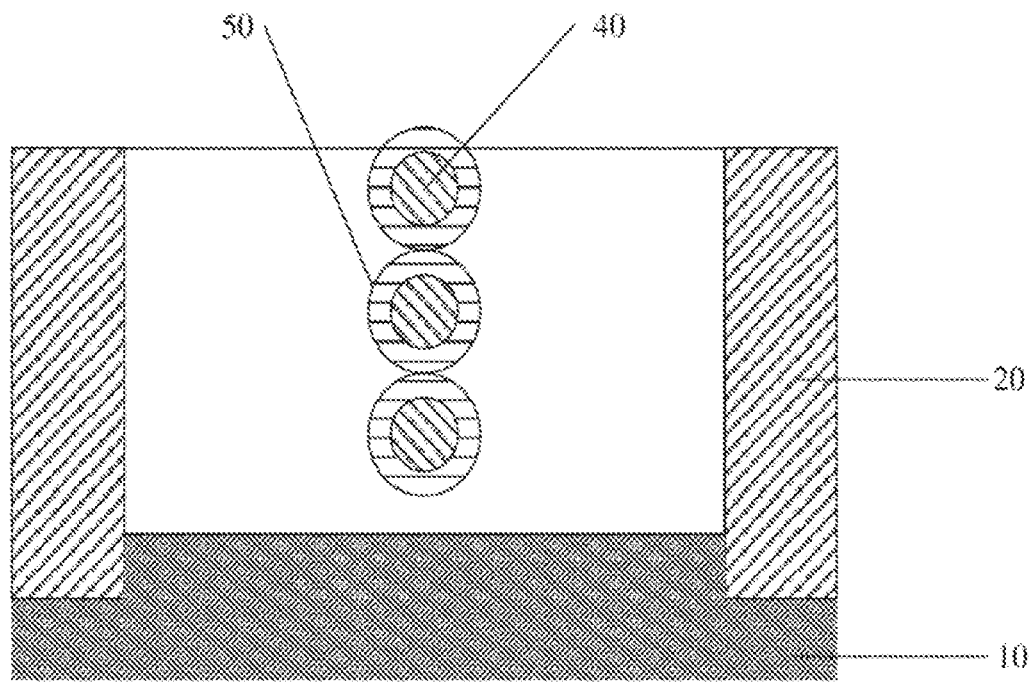

In step S104, an array of nanowires is formed in the MOSFET region. Referring to FIG. 1A, a method for forming the array of nanowires in MOSFET region comprises: forming a sacrificial oxide layer around each of the stacked nanowires in order to adjust the size and shape of each of the stacked nanowires and removing the sacrificial oxide layer to obtain the array of nanowires. As shown in FIG. 3C, a sacrificial oxide layer 50 is formed around each of the stacked nanowires 40, and further control the size and shape of each nanowire, in this embodiment, the size and shape of the nanowire array 40 are adjusted and resulted in a circular shape as shown in FIG. 3C due to stress effect after the sacrificial oxide layer 50 is formed around each of the stacked nanowires 40; and then the sacrificial oxide layer 50 is removed to form the array of nanowires.

The material of the nanowires included in the array is selected from a group consisting of Si, SiGe, Ge, II-VI, metals and metal silicide, etc. For instance, when the MOSFET is an NMOSFET, the material of nanowires can be one of Si, III-V, II-VI, metal and metal silicide. When the MOSFET is a PMOSFET, the material of nanowires can be one of Si, SiGe, Ge, Si, III-V, II-VI, metal and metal silicide. In one embodiment, the material of the substrate of the MOSFET is silicon, the material of the nanowires included in the nanowire array is also silicon, and the MOSFET region is correspondingly for forming an NMOSFET, and the NMOSFET adopting the silicon nanowire array is beneficial to increase the electron mobility of the NMOSFET.

Figure 1B:
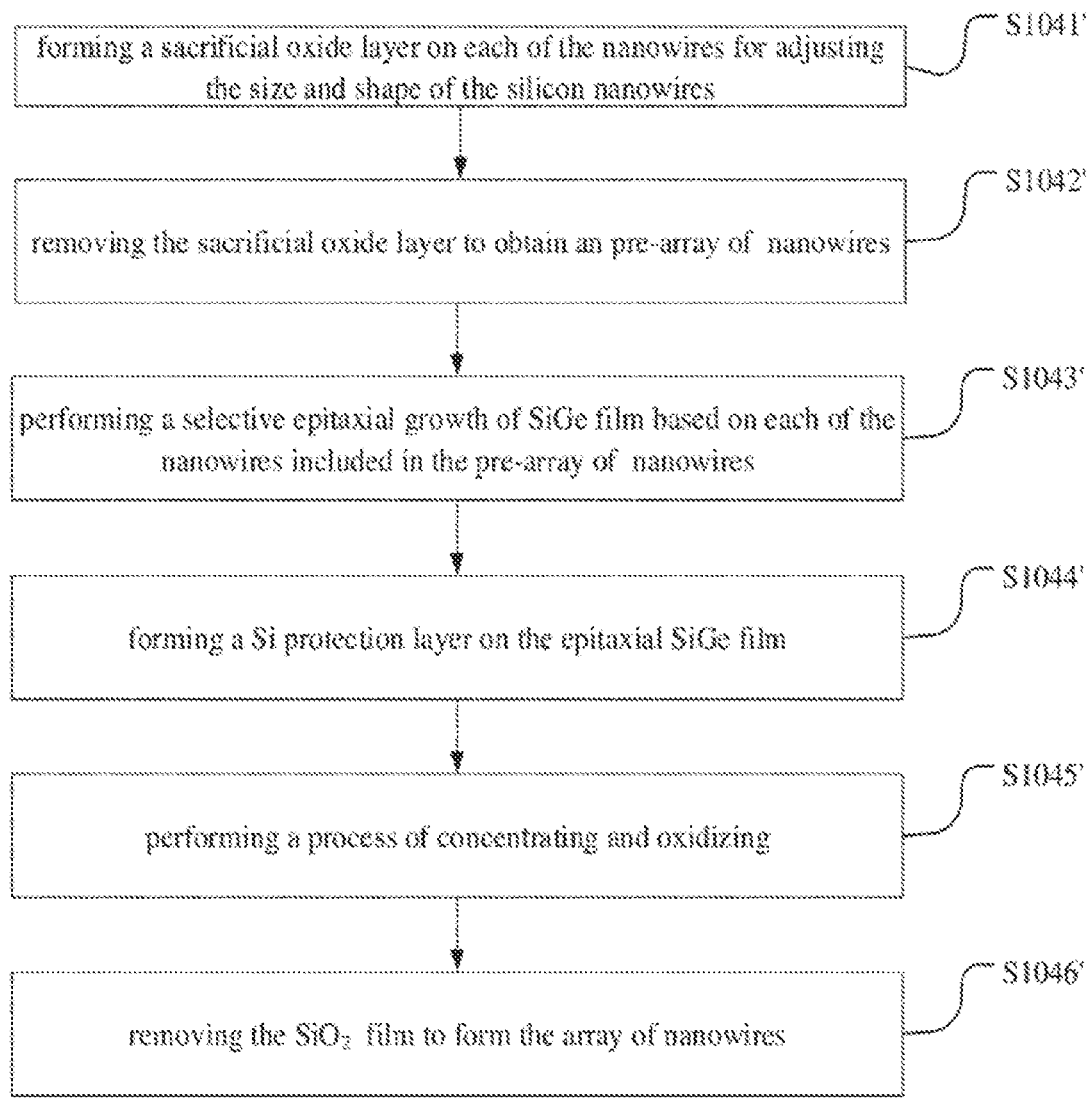
FIG. 1B is a flow chart of another method for forming the array of nanowires in accordance with the embodiment as described in FIG. 1.

In another embodiment, the MOSFET region is correspondingly for forming a PMOSFET, and the material of the nanowire in the nanowire array is SiGe, and the PMOSFET adopting the SiGe nanowire can greatly improve the hole mobility. According to FIG. 1B, the present invention further discloses another method of forming a SiGe nanowires, comprising: etching Si on the Si substrate to form stacked nanowires, forming a sacrificial oxide layer on each of the stacked silicon nanowires for adjusting the size and shape of the stacked silicon nanowires, and removing the sacrificial oxide layer to obtain an pre-array of nanowires; then performing SiGe selective epitaxial growth on each of the silicon nanowires in pre-array and epitaxially depositing a Si protection film on the epitaxial SiGe film, and further performing a process of concentrating and oxidizing based on the Si protective film, and removing the SiO2 film, obtaining a stacked SiGe nanowire in the second array. For example, the process of concentrating and oxidizing is performed at a temperature between 750° C. and 900° C., and the lasting time is 8 hours to 15 hours, a thickness of the epitaxial SiGe film is between 5 nm and 20 nm, and a thickness of the Si protective film is between 0 nm and 3 nm. That is, the step of depositing a Si protection film on the epitaxial SiGe film is optional, it depends on the specific application.

Figure 3D:
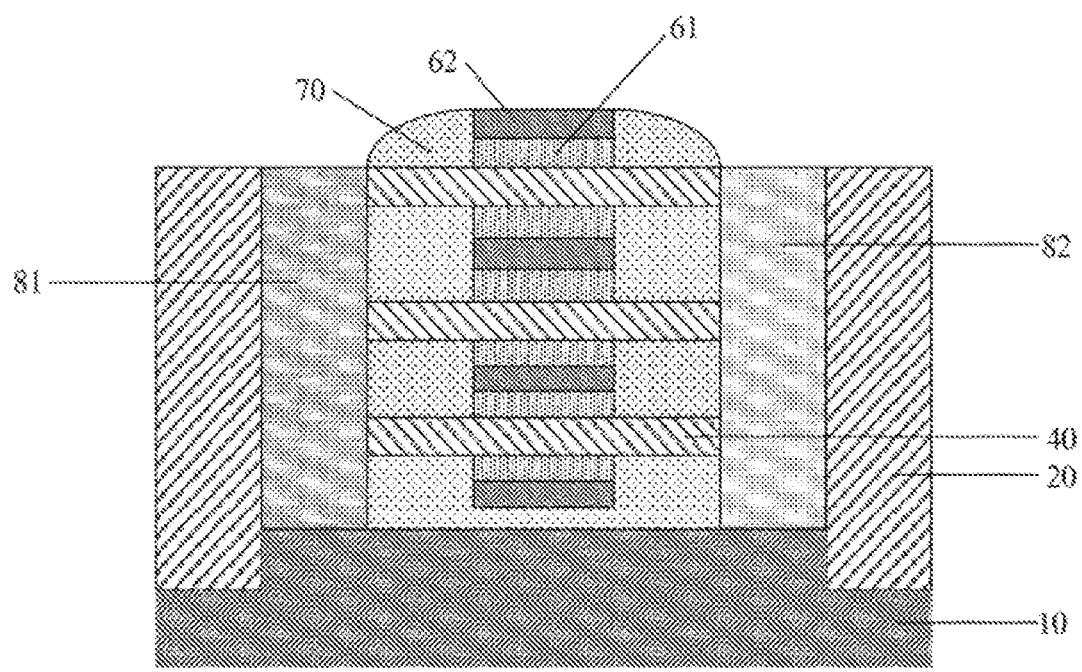

Preferably, this manufacturing method described above comprises the following steps: forming a dummy gate stack in the MOSFET region, a gate sidewall surrounding the dummy gate stack, P+ or N+ doped source and drain regions on opposite sides of the sidewall; removing the dummy gate stack to expose each nanowire of the nanowire array. As an example, a gate opening is formed inside the gate spacer to expose a surface of the nanowire array structure recess. Refer to FIG. 3D, 81, 82 are source region and drain region, respectively, wherein the source region 81 and the drain region 82 are located at two sides of the nanowire array, respectively, a dummy gate stack 60 (not shown in FIG. 3D) consists of 61 and 62, 70 is a gate sidewall surrounding the dummy gate stack 60. In one embodiment, the dummy gate stack 60 comprises a dummy gate dielectric 61 and a dummy gate conductor 62, as an example, the material of the dummy gate dielectric 61 can be silicon oxide, the material of the dummy gate conductor 62 can be polysilicon, α-Si, and etc.

Figure 3E:
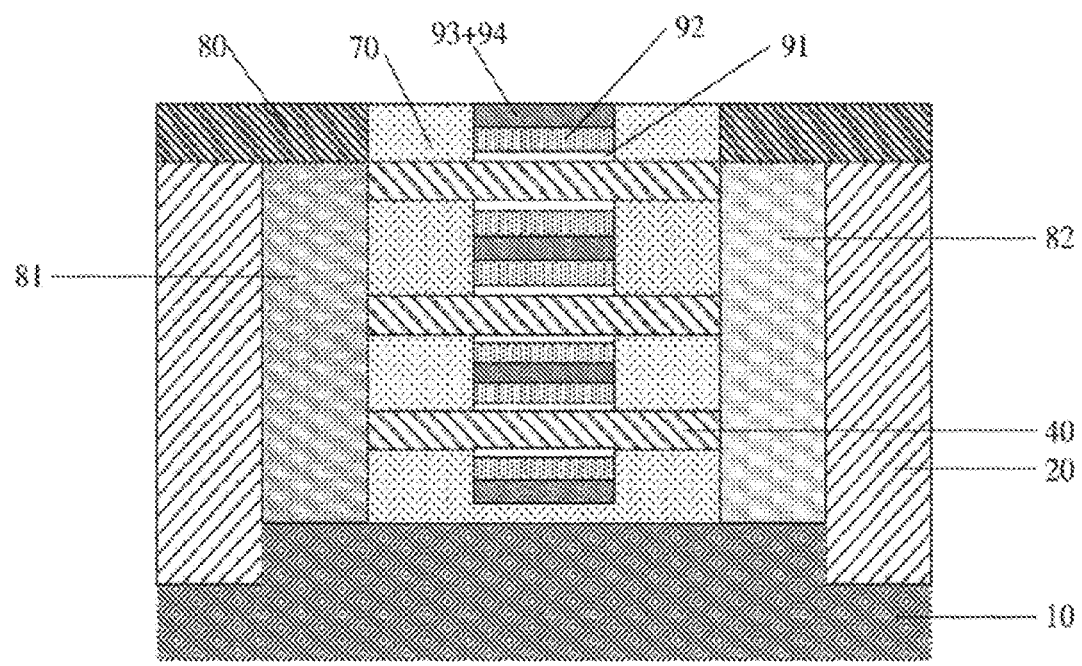

Preferably, the present manufacturing method further comprises the following steps: forming a silicide region on the surface of the source region and drain region; forming an interlayer dielectric layer 80 for overlying the source and drain regions, the surface of the gate sidewalls and the dummy gate stack 60; polishing the surface of the interlayer dielectric layer 80 (as shown in FIG. 3E) with CMP (Chemical mechanical polishing planarization) to expose the top surface of the dummy gate stack, and removing the dummy gate stack in order to expose each nanowire of the array of nanowires.

For example, when the MOSFET is a PMOSFET, a method for forming the source region and the drain region in MOSFET comprises: performing silicon etching on the source region and the drain region after the gate sidewall is formed; and the sidewall spacer is appropriately over-etched to form an corresponding inner recess (not shown) that surrounding each of the nanowires within the array; and performing selective P+ epitaxy to form corresponding P+ doped source regions 81 and P+ doped drain region 82 of the MOSFET, respectively. The P+ doped source and drain regions will increase the hole mobility of the PMOSFET due to the lateral compressive stress on the channel. For example, when the nanowire within the nanowire array is SiGe, a selective P+ doped epitaxy using Boron (B) ion is performed to form a P+ doped SiGe source region 81 and a P+ doped drain region 82 of the PMOSFET, respectively. For another example, when the nanowire is Si, a selective P+ doped epitaxy using Boron ion is performed to form a P+ doped Si source region 81 and a P+ doped drain region 82 of the PMOSFET, respectively.

Figure 1C:
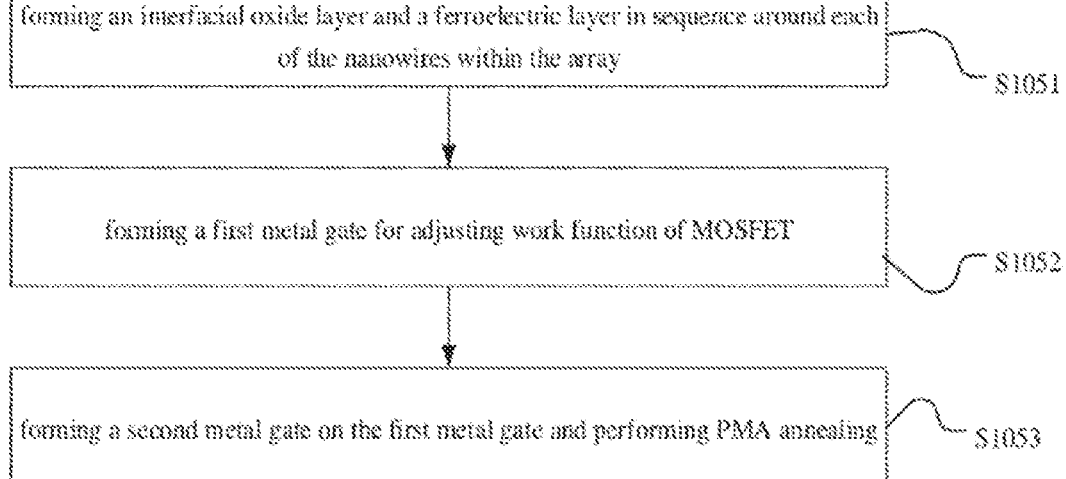
FIG. 1C is a flow chart of a method for forming the interfacial oxide layer, the ferroelectric layer and the stacked metal gate in accordance with the embodiment as described in FIG. 1.

In step S105, an interfacial oxide layer, a ferroelectric layer and a stacked metal gate are formed in sequence around each of the nanowires. Referring to FIG. 1C, a method for forming the interfacial oxide layer, the ferroelectric layer and the stacked metal gate in sequence around each of the nanowires comprises: step 1051, forming an interfacial oxide layer, a ferroelectric layer in sequence around each of the nanowires within the nanowire array; step 1052, forming a first metal gate layer on the ferroelectric layer for adjusting the work function of MOSFET; step 1053, forming a second metal gate layer on the first metal gate and performing PMA annealing.

There are various ways to deposit the interfacial oxide layer, the ferroelectric layer, the first metal gate layer or the second metal gate layer in turn around each nanowire in the nanowire array, including but not limited to: forming the interface oxide layer by rapid thermal oxidation, chemical oxidation, and O3 oxidation, etc. There are various ways to deposit the ferroelectric layer, the first metal gate or the second metal gate, including but not limited to: atomic layer deposition (ALD), plasma enhanced chemical vapor deposition (PECVD), metal organic chemical vapor deposition (MOCVD), physical vapor deposition (PVD) or the like. Referring to FIG. 3E, the cross-sectional view of the transistor, the interfacial oxide layer 91 is deposited around each of nanowires within the first nanowire array, the ferroelectric layer 92 is deposited around each of the interfacial oxide layer 91, the first metal gate 93 is deposited around each of the ferroelectric layer 92, the second metal gate 94 is deposited around each of the first metal gate 93.

In this embodiment, the interfacial oxide layer 91 can be one of SiO2, SiON, HfO2, ZrO2, Al2O3, AlN, HfSiO, HfSiON, HfAlON, Y2O3, La2O3 or HfLaON. The ferroelectric layer 92 can be a doped Hf-based oxide, and the doped Hf-based oxide can be one or more of HfZrO, HfZrAlO, HfAlO, HfSiO, HfLaO, HfSrO, HfGdO and HfYO, the ferroelectric performance strength of the ferroelectric layer is related to the type and content of doping elements therein. As a preferred example, for the content of the doping element therein, as a preferable example, optimized percentage ranges of Zr, Si, Y, Al, Gd, Sr and La contents are 30-60%, 3-6%, 4-6.5%, 3.5-6.5%, 1.5-4%, 8-12%, and 2-5%, respectively.

For example, when the ferroelectric gate dielectric layer is the HfZrO material, the Zr content in the HfZrO material has a large percentage, and the optional content range is also large. In HfZrO, when Hf:Zr is 1:1, the ferroelectricity is the best. When Hf:Zr>1, para-electricity will occur with the increasing of Hf content, and when Hf:Zr<1, anti-ferroelectricity will occur with the increasing of Zr content. HfZrO material has a larger Zr content selection interval, which makes the manufacturing process has a larger process window and is easy to control. HfZrO generally adopts rapid thermal annealing at 400° C.-550° C. under the action of external electrode clamping to form good ferroelectricity, which is in line with mainstream processes in advanced semiconductor industry at present, that is, the high-k/metal gate last integration process, and to avoid the influence of high temperature source-drain process on the performance of CMOS devices, so that good performance on negative-capacitance electrical characteristics can be achieved.

For another example, when the ferroelectric gate dielectric layer is HfAlO or HfSiO, Al and Si are commonly used materials in the MOSFET manufacturing processes, and have good compatibility with standard CMOS manufacturing processes. HfAlO or HfSiO can achieve good ferroelectricity after treated by a high temperature annealing process at the temperature between 800° C. and 1000° C. under the action of external electrode clamping; HfAlO and HfSiO ferroelectric materials can withstand high temperature processes and improve reliability of gate dielectric.

For another example, when the ferroelectric gate dielectric layer is HfLaO, its residual polarization strength is large, the dielectric constant is high, and the leakage is small.

In step S1052, a MOSFET work function may be adjusted by depositing a first metal gate layer on the ferroelectric layer. In one embodiment, a method of forming the first metal gate comprises: forming a first metal gate on the ferroelectric layer; and adjusting work function of MOSFET by doping isotropic plasma N-type dopant (NMOSFET) or isotropic plasma P-type dopant (PMOSFET) in the first metal gate. Preferably, the dopant ions can only distribute in the first metal gate layer 93. For example, the energy of the plasma can be adjusted to control the dopant ions only to distribute in the first metal layer 93. In addition, the doping amount can be calculated according to a desired threshold voltage of MOSFET. For example. When the transistor is an NMOSFET, the work function of NMOSFET shall be adjusted by doping isotropic plasma N-type dopant in the first metal gate, which can reduce the effective work function, wherein the N-type dopant can be one or more of a hydride of phosphorus, fluoride of phosphorus, hydride of arsenic or fluorine of arsenic. For another example, when the transistor is a PMOSFET, the work function of PMOSFET shall be adjusted by doping isotropic plasma P-type dopant, which can increase the effective work function. For example, the N-type dopant comprises: hydrides or fluorides of phosphorus and arsenic, which may be, but not limited to be selected from a group consisting of phosphane, arsinane, phosphorus pentafluoride, phosphorus trifluoride, arsenic pentafluoride and arsenic trifluoride; in another embodiment, when the transistor is a PMOSFET, the work function of the PMOSFET can be adjusted by doping an isotropic plasma P-type dopant ion, where the P-type dopant ion can increase the effective work function, the P-type dopant comprises: hydrides, fluorides or chlorides of boron, which may be, but not limited to be selected from a group consisting of B2H6, B4H10, B6H10, B10H14, B18H22, BF3 and BCl3.

In another embodiment, a metal gate work function process may be used to deposit a first metal gate layer to adjust the MOSFET work function, that is, the work function of MOSFET can be adjusted by N-type or P-type metal gate work function process, wherein N-type work function metal can reduce the work function of MOSFET and P-type work function metal can increase the work function of MOSFET respectively. For example, when the MOSFET is NMOSFET, the first metal gate can be formed on the ferroelectric gate dielectric layer by using N-type metal gate work function process, and the first metal gate which can be one or a combination of Al, Ta, Ti, Zr, Nb, Hf, TiAl, TiAlC, TaN, TaC, TaAlC and TaAl. For another example, when the MOSFET is PMOSFET, the first metal gate can be formed on the ferroelectric gate dielectric layer by using P-type metal gate work function process, and the first metal gate which can be one or a combination of Pt, Ni, Ir, Re, Mo, Co, TiN, TiNC, MoN, and WN.

In step S1053, a second metal gate 94 can be formed on the first metal gate 93 and covers the first metal gate 93 to fill the gate openings, and a PMA annealing process is performed. Therefore, on one hand, dipoles at the interface are formed to adjust the effective work function of transistor, on the other hand, the ferroelectric phase is formed, and the negative capacitance effect is induced due to the clamping effect of the metal electrodes in the PMA annealing process. For example, the PMA annealing is performed at a temperature of 350° C. to 950° C., lasting for a time between 20 seconds to 40 seconds. Annealing can be performed by RTA annealing, Spike annealing or laser annealing, which depends on the thermal properties of the ferroelectric material.

In one embodiment, the second metal gate includes a multilayer metal material. For example, a second metal gate includes a metal layer next to the first metal gate layer which can be selected from a metal with good oxygen absorption performance, including: at least one of Ti, TiAl, and Ta; and then a barrier layer, including: one or two of TiN, TaN, Ta, MoN, AlN; finally a filling metal layer, including one or more of W, Al, TiAl, TiAlC, or Mo.

In present disclosure, preferably, the thickness of the interfacial oxide layer 91 is between 0.5 and 1.5 nm; the thickness of the ferroelectric layer is between 1 nm and 10 nm, and is preferably between 1 nm and 5 nm; the thickness of the first metal gate 93 is between 1 nm and 10 nm.

The first metal gate layer and/or the second metal gate layer can be deposited by a deposition process such as PVD, CVD, or ALD. Different film stress can be obtained by optimizing deposition process parameters comprising thickness, deposition power, gas flow rate, composition of film, and etc. For example, when a TiNx film is deposited by a PVD process, different process parameters can be used to obtain compressive stresses of −2.5 to −8 GPa. For example, when the thickness of the TiNx film is 10 nm and the sputtering power is 600 W, experiments show that as the N2 flow rate increases from 2.0 SCCM to 6.0 SCCM, the compressive stress of TiNx film increases rapidly from −3.2 GPa to −6 GPa. As the N2 flow rate increases from 10 SCCM to 20 SCCM, the film compressive stress is reduced by 2 GPa to get the highest compressive stress of TiNx film, its N2 flow rate should be controlled between 6 SCCM-10 SCCM.

At last, after the well-known contacts and interconnections are completed, the above-mentioned low-power ring-gate stacked nanowire array MOSFET with negative capacitance effect is completed.

Referring to FIG. 3E, a cross-sectional view of a transistor is provided. In the MOSFET region, the interface oxide layer 91 is wrapped on each nanowire within the nanowire array, and the ferroelectric layer 92 is wrapped on the interface oxide layer 91. The first metal gate layer 93 is wrapped on the ferroelectric layer 92, and the second metal gate layer 94 is filled and wrapped on the first metal gate layer 93.

The use of a thin ferroelectric gate dielectric layer as the gate dielectric has a larger gate capacitance, hereby improving the gate's ability to control the channel to obtain more excellent electrical performance. The mainstream process of MOSFET at present uses a fully gate-last integration process, Based on different technology generations, the corresponding gate trench widths (corresponding to Gate Length) are different. For 28/22 nm advanced process technology generations, the gate trench width is generally required to be no greater than 25 nm, so the thickness of the ferroelectric gate dielectric layer cannot exceed 3 nm, thus which can meet the advanced process requirements of the 22 nm technology generation. With the continuous scaling of technology generation, the width of gate trench is required to be smaller and smaller, so that the thickness of the ferroelectric layer has also to be thinner and thinner. For more advanced technology generations of 14 nm, 10 nm, 7 nm, 5 nm, 3 nm and below, the gate trench width is further reduced, which requires that the thickness of the ferroelectric gate dielectric layer be further reduced to 2 nm, 1.5 nm or 1 nm.

The present application also provides a ring-gate stacked nanowire array MOS field-effect transistor having a negative capacitance effect, and the transistor can be manufactured by a method described in the present disclosure with reference to FIG. 1. As shown in FIG. 3E, the transistor with the negative capacitance comprises: a substrate 10, MOSFET region, a MOSFET region formed on the substrate 10, an array of nanowires 40 in the MOSFET region; a source region 81 and drain regions 82, which are separated by the first array of nanowires 40 in the MOSFET region; an interfacial oxide layer 91, a ferroelectric layer 92, a stacked metal gate consists of a first metal gate layer 93 and a second metal gate layer 94 sequentially formed around each of the nanowires within the array; and a gate sidewall 70 which surrounding the interfacial oxide layer 91, the ferroelectric layer 92, and the stacked metal gate.

The material of the nanowires included in the first array is selected from a group consisting of Si, SiGe, Ge, II-VI, metals and metal silicide, etc. In one embodiment, the substrate of the MOSFET is silicon, the material of the nanowires included in the first array is silicon, so that this MOSFET is NMOSFET, the first array of silicon nanowires can improve electron mobility performance of NMOSFET.

In this embodiment, the interfacial oxide layer 91 can be one of SiO2, SiON, HfO2, ZrO2, Al2O3, AlN, HfSiO, HfSiON, HfAlON, Y2O3, La2O3 or HfLaON.

The ferroelectric layer 92 can be doped as Hf-based oxide. The doped Hf-based oxide can be one or more of HfZrO, HfZrAlO, HfAlO, HfSiO, HfLaO, HfSrO, HfGdO and HfYO, and the corresponding ratios of doping element Zr, Si, Y, Al, Gd, Sr and La are between 30-60%, 3-6%, 4-6.5%, 3.5-6.5%, 1.5-4%, 8-12% and 2-5%, respectively.

The first metal gate 93 can be one or more of Ti, Al, Ta, Hf, Ru, Mo, W, TiN, TiC, TiAl, TiAlC, TiSiN, TaC, TaN, TaAlC, TaAl, TaCN, NbAlC, MoN, ZrN, WN, TiWN. The second metal gate 94 covers the first metal gate 93 to fill a gate opening, dipole at the interface is formed to adjust the effective work function; on the other hand, a clamping of metal electrodes during the PMA process induces the ferroelectric negative capacitance effect. For example, a second metal gate 94 comprises a multiple layer of metal materials, wherein a metal layer with good oxygen absorption performance adjacent to the first metal gate can be one of Ti, TiAl, and Ta, then a barrier metal layer adjacent to the metal layer with good oxygen absorption performance can be one or more of TiN, TaN, Ta, MoN, AlN and WN, furthermore, a filling metal layer can be one or more of W, Al, TiAl, TiAlC and Mo.

In present disclosure, preferably, the thickness of the interfacial oxide layer 91 is between 0.5 and 1.5 nm; the thickness of the ferroelectric layer is between 1 nm and 10 nm, and is preferably between 1 nm and 5 nm; the thickness of the first metal gate 93 is between 1 nm and 10 nm. The gate dielectric using a ferroelectric layer with smaller thickness has a larger gate capacitance, thereby the channel can be better controlled by the gate, and a better electrical performance can be achieved.

By optimizing a matching relationship between the ferroelectric layer and the interfacial oxide layer, on one hand, a great surface potential amplification effect can be obtained, thus an ultra-steep subthreshold swing can be achieved, on the other hand, threshold voltage hysteresis can be reduced, thus a zero-hysteresis transfer characteristic curve can be obtained. The potential amplification factor for the negative capacitance effect is as follows:

$$\beta = \partial V_{int}/\partial V_g = C_{FE}/(C_{FE} + C_{int}).$$

Among them, Vg and Vint are gate voltage and ultra-thin gate voltage, respectively, and CFE and Cint are ferroelectric capacitor and ultra-thin gate capacitor, respectively. It can be seen from the above formula that in order to achieved a higher surface potential amplification and zero-hysteresis characteristics, the absolute value of the negative capacitance (|CFE|) of the ferroelectric gate dielectric and the ultra-thin gate capacitance (Cint) must be satisfied need to be approximately equal; and to make a total capacitance of the ferroelectric gate dielectric and the ultra-thin gate dielectric layer must be positive.

In addition to adjusting the work function, the first metal gate layer 93 also introduces stress into the ferroelectric layer 92, and the ferroelectric layer 92 is transformed from non-ferroelectric to ferroelectric by combining with a rapid thermal annealing process. And the size of the integrated work function and stress can be optimized according to device requirements. The magnitude of tress applied to the ferroelectric gate dielectric layer 92 can be changed by adjusting the thickness, formation process, and composition of the first metal gate.

The second metal gate 94 can effectively reduce the contact resistance of the electrodes, and can also introduce stress into the ferroelectric gate dielectric layer 92. Therefore, the magnitude of the stress applied on the ferroelectric gate dielectric layer can be adjusted by changing the thickness, formation process and composition of the second metal gate layer, and thereby optimizing the ferroelectricity of the ferroelectric gate dielectric layer.

The present disclosure provides another field-effect transistor with negative capacitance, and to provide a method for fabricating the same. In one embodiment, the transistor has an NMOSFET region and a PMOSFET region, the NMOSFET region includes a first array of nanowires which can improve an electron mobility performance of NMOSFET, the PMOSFET region includes a second array of nanowires which can improve the hole mobility of PMOSFET. Moreover, the structure of gate-all-around nanowires greatly improves gate control capability and excellently suppresses short-channel effects. In particular, a ferroelectric negative capacitance effect is introduced into the transistor which adopts gate-all-around process of the present disclosure, effectively increasing a surface potential of the channel of the transistor to be greater than an applied gate voltage, thereby achieving voltage amplification, breaking the Boltzmann limit of the sub-threshold swing, achieving ultra-steep sub-threshold swing and higher Ion/Ioff current ratio, and meeting the requirements of high-performance integrated circuits.

Figure 2:
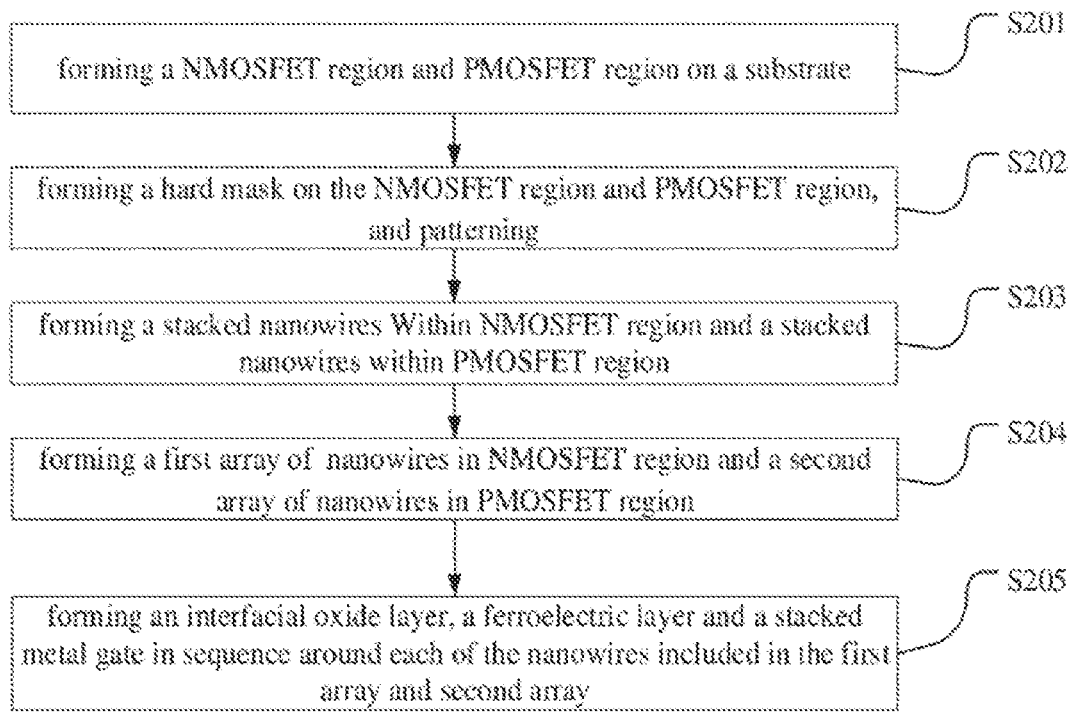
FIG. 2 is a flow chart of another method for fabricating a transistor according to another embodiment of the present disclosure.

FIG. 2 is a flow chart of another method for fabricating the transistor with negative capacitance according to another embodiment of the present disclosure. A manufacturing method of transistor comprises: forming an NMOSFET region and PMOSFET region on a substrate, wherein the NMOSFET region and the PMOSFET region are separated by shallow trench isolation; and forming a hard mask on the NMOSFET region and the PMOSFET region, and patterning through the hard mask; and forming a multiple of stacked nanowires in the NMOSFET region and a multiple of stacked nanowires in the PMOSFET region respectively; and forming a first array of nanowires in the NMOSFET region and forming a second array of nanowires in the PMOSFET region; and forming an interfacial oxide layer, a ferroelectric layer and a stacked metal gate in sequence around each of the nanowires included in the first array and the second array.

Referring to FIG. 2, the method for manufacturing the field-effect transistor with negative capacitance in accordance of the present disclosure comprises following steps.

Figure 4A:
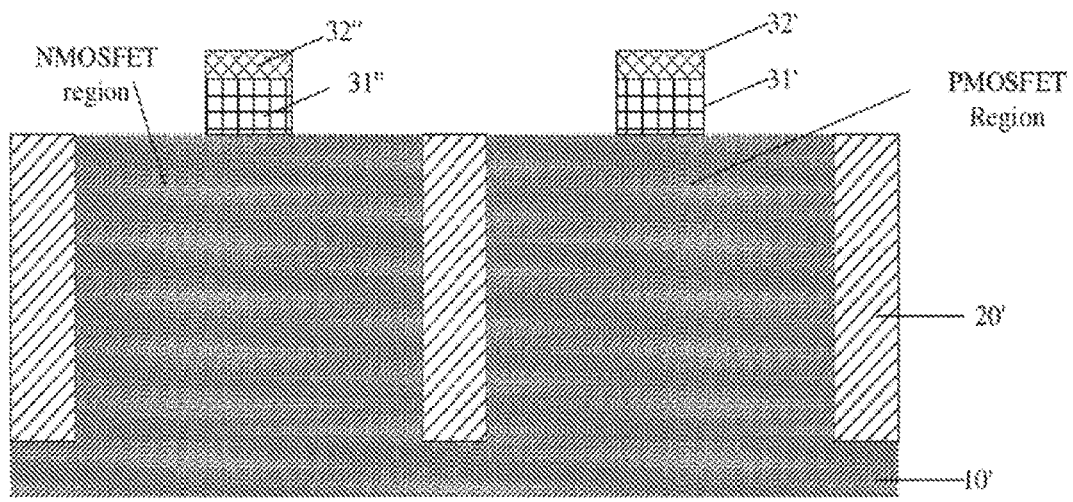
FIG. 4A to 4E are cross-sectional views illustrating various steps of a method for manufacturing the field-effect transistor according to another embodiment of the present disclosure.

In step S201, forming an NMOSFET region and a PMOSFET region on a substrate. Referring to FIG. 4A, the NMOSFET region and the PMOSFET region are formed on a substrate 10', the NMOSFET region and the PMOSFET region are separated by a shallow trench isolation 20'. According to the present disclosure, the substrate 10' is a normal semiconductor substrate, which may be a silicon substrate, an SOI substrate, or the other semiconductor substrate.

In step S202, a hard mask with pattern are formed in the NMOSFET region and the PMOSFET region. There are various methods for depositing the hard masks, such as LPCVD, PECVD, ALD, MOCVD, PVD and furnace tube thermal oxidation. There are various methods for patterning, include photolithography and etching process, photolithography process can be one of optical exposure, electron beam exposure, nanoimprint process, focusing ion deposition and so on. Etching process includes plasma etching, reactive ion etching, and ion beam etching. In one embodiment, a hard mask film of PECVD SiO2 layer 31 and LPCVD α-Si layer 32 is sequentially deposited on the MOSFET region, as shown in FIG. 4A; a glue pattern is formed by electron beam exposure, a photoresist pattern is formed by electron beam exposure on the α-Si layer 32' and a hard mask of SiO2 layer 31 and the α-Si layer 32, as shown in FIG. 4A, having a nanowire pattern is formed by reactive ion etching. SiO2 31' layer and α-Si 32' layer is the cross-sectional view of the hard mask with a nanowire pattern.

In step S203, a multiple of stacked nanowires are formed in the NMOSFET region and a multiple of stacked nanowires are formed in the PMOSFET region, respectively. In one embodiment, the stacked nanowires are formed in the NMOSFET region and the PMOSFET region, respectively, by repeated alternating anisotropic and isotropic plasma etching in MOSFET region; and after each step of etching, the surface of each of the exposed nanowires is oxidized by plasma to form a passivation film and the passivation film on the surface of the substrate in the MOSFET region is removed by anisotropic plasma to facilitate the subsequent etching.

The etching power, gas composition, etching time and other parameters can be determined according to the requirements of the size and shape of the nanowires. In one embodiment, when anisotropic plasma etching are used, the anisotropic plasma etching gas may be one or more of HBr, Cl2, O2, and He, and the energy of the anisotropic plasma etching is between 150 W and 500 W; when isotropic plasma etching are used, the isotropic plasma etching gas can be one or more of SF6 and He, and the energy of the isotropic plasma etching is between 200 W and 800 W. For example, the anisotropic plasma gas can be HBr, Cl2, O2, wherein the ratio of Cl2:HBr is between 1:1 and 1:5, and the additive is O2; the isotropic plasma gas can be SF6, He, wherein the ratio of SF6:He is between 1:3 and 1:20.

Figure 4B:
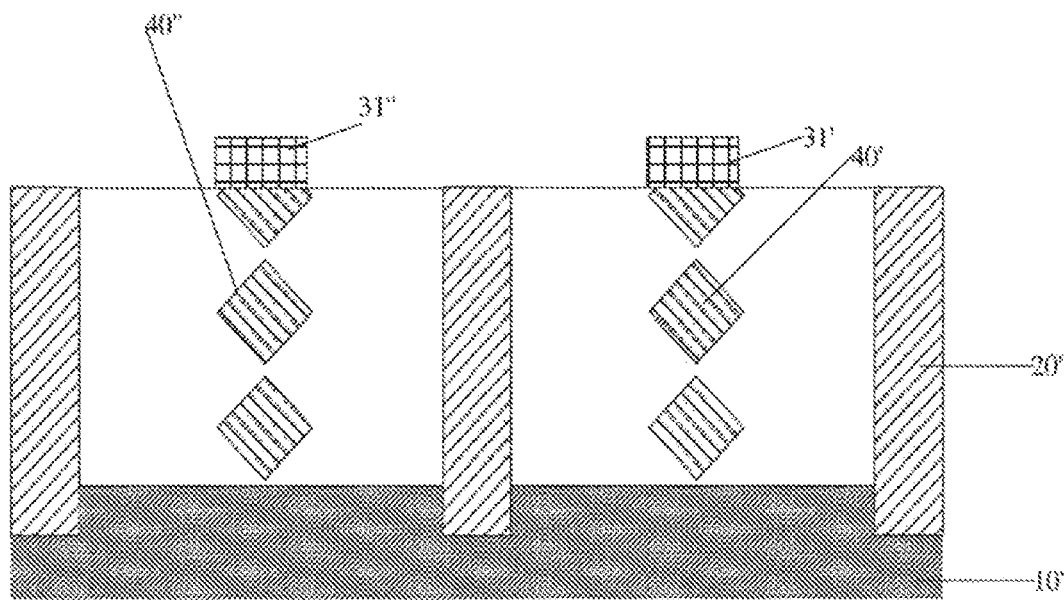

In one embodiment, the number of stacked nanowires may be more than one. Referring to FIG. 4B, three stacked silicon nanowires 40 are formed in the NMOSFET region and the PMOSFET region, respectively. Three nanowires are only taken as an example according to the present disclosure, but the number of the stacked silicon nanowires is not limited in the present disclosure.

In step S204, a first array of nanowire is formed in the NMOSFET region and a second array of nanowire is formed in PMOSFET region. The material of the nanowires included in the first array is selected from a group consisting of Si, III-V, II-VI, metals and silicide thereof. The material of the nanowires included in the second array is selected from a group consisting of Si, SiGe, Ge, II-VI, metals and silicide thereof.

In one embodiment, the substrate is bulk silicon substrate, the nanowires within the first array is silicon, the nanowires within the second array is SiGe. Since the first array of nanowires and the second array of nanowires are formed in the NMOSFET region and the PMOSFET region in subsequent steps, forming nanowires on bulk silicon substrate has significant advantages over forming nanowires on SOI substrate, for example, the bulk silicon substrate eliminates self-heating effect and floating body effect which may be produced by SOI substrate, avoids complicated source-drain process, has a better compatibility with traditional bulk silicon CMOS process and a lower cost than the SOI substrate, etc.

Figure 2A:
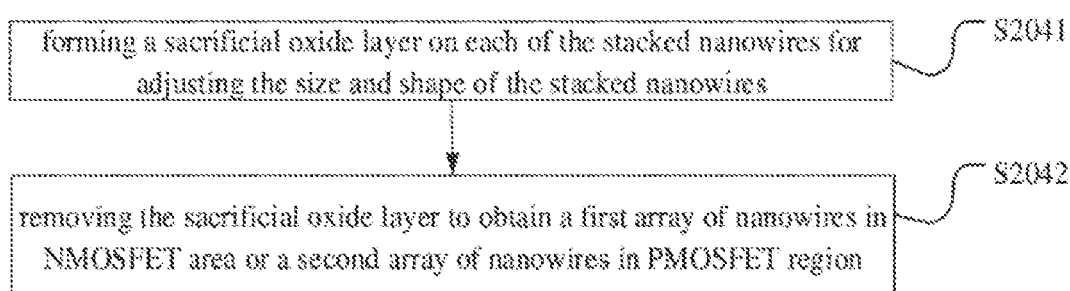
FIG. 2A is a flow chart of a method for forming the first array or the second array in accordance with the embodiment as described in FIG. 2.
Figure 4C:
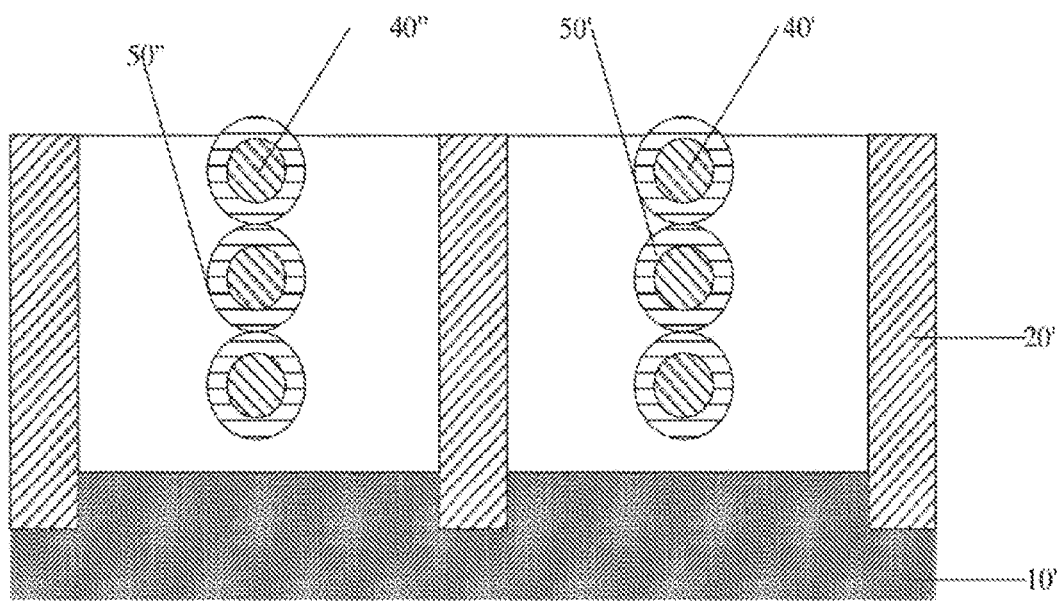

Refer to FIG. 2A, a method for forming the first array of nanowires in NMOSFET region is provide herein, comprising: forming a sacrificial oxide layer around each of the stacked nanowires within NMOSFET region for adjusting the size and shape of each of the stacked nanowires, and removing the sacrificial oxide layer to obtain the first array of nanowires, for example, the nanowires within the first array is silicon. As shown in FIG. 4C, the sacrificial oxide layer 50" is formed on each of the stacked nanowires 40" within the NMOSFET region to remove plasma etching damage and further control the size and shape of each nanowire, the size and shape of the nanowires 40" are respectively adjusted and resulted in a circular shape as shown in FIG. 4C due to stress effect after the sacrificial oxide layer 50" are formed on each of the multiple stacked nanowires 40"; and then removing the sacrificial oxide layer 50" to achieve the first array of nanowires.

Refer to FIG. 2A, a method for forming a second array of nanowires in PMOSFET region is provided, comprising: forming a sacrificial oxide layer on each of the stacked nanowires within PMOSFET region for adjusting the size and shape of each of the stacked nanowires, and removing the sacrificial oxide layer to obtain the second array of nanowires, for example, the nanowires within the second array is silicon. As shown in FIG. 4C, the sacrificial oxide layer 50' is formed on each of the stacked nanowires 40' within the PMOSFET region to remove plasma etching damage and further control the size and shape of each nanowire, the size and shape of the nanowires 40' are respectively adjusted and resulted in a circular shape as shown in FIG. 4C due to stress effect after the sacrificial oxide layer 50' are formed on each of the multiple stacked nanowires 40'; The sacrificial oxide layer 50' is then removed to form the second nanowire array or the second nanowire pre-array.

Figure 2B:
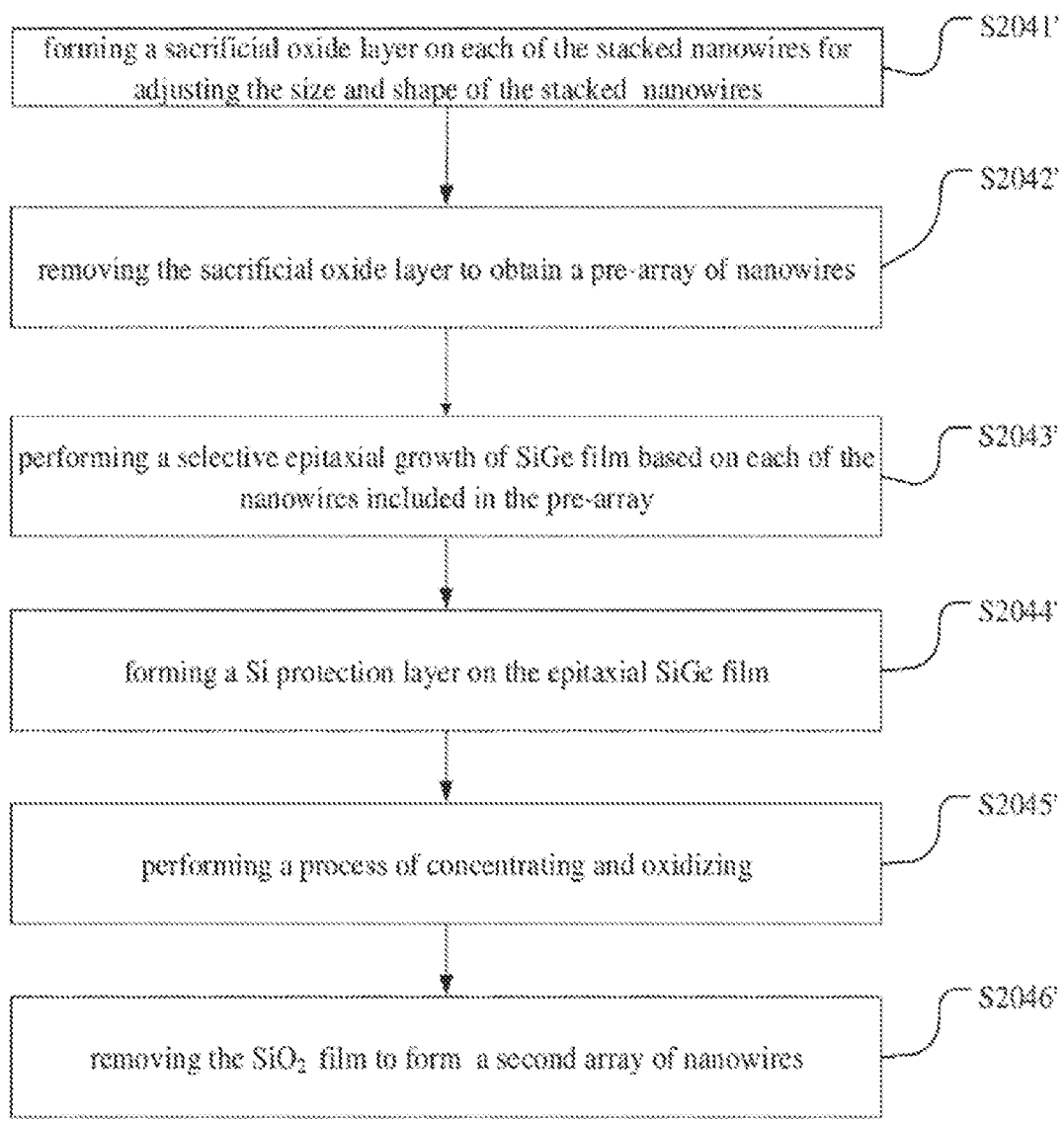
FIG. 2B is a flow chart of another method for forming the second array nanowires in accordance with the embodiment as described in FIG. 2.

Referring to FIG. 2B, another method for forming a second array of nanowires is provided, comprising: forming a sacrificial oxide layer on each of the of stacked nanowires for adjusting the size and shape of the stacked nanowires, and removing the sacrificial oxide layer to obtain an pre-array of nanowires, which is similar to the above method; and performing a selective epitaxial growth of SiGe film based on each of the nanowires within the pre-array; forming a Si protection film on the epitaxial SiGe film; and performing a process of concentrating and oxidizing based on the Si protective film; and removing the SiO2 film to form the second array of nanowires, wherein the nanowires included in the second array is SiGe nanowires. For example, the process of concentrating and oxidizing is performed at a temperature between 750° C. and 900° C., lasting for a time between 8 hours and 15 hours, and wherein a thickness of the epitaxial SiGe film is between 5 nm and 20 nm, and wherein a thickness of the Si protective film is between 0 nm and 3 nm. In some embodiments, depositing a Si protective film on the epitaxial SiGe film is optional, depending on the specific application.

As shown in FIG. 4C, a sacrificial oxide layer 50' is formed on each of the stacked nanowires 40' within the PMOSFET region to remove etching damage and further control the size and shape of each nanowire, for example, the size and shape of the nanowire 40' within the PMOSFET region is adjusted and resulted in a circular shape as shown in FIG. 4C due to stress effect after the sacrificial oxide layer 50' are formed on each of the stacked nanowires 40'.

In specific applications, for example, when the multiple of the stacked nanowires within NMOSFET region is silicon, which can improve the electronics mobility of NMOSFET, while the multiple of the stacked nanowires within PMOSFET region is SiGe nanowires, which can improve the hole mobility of PMOSFET.

Figure 4D:
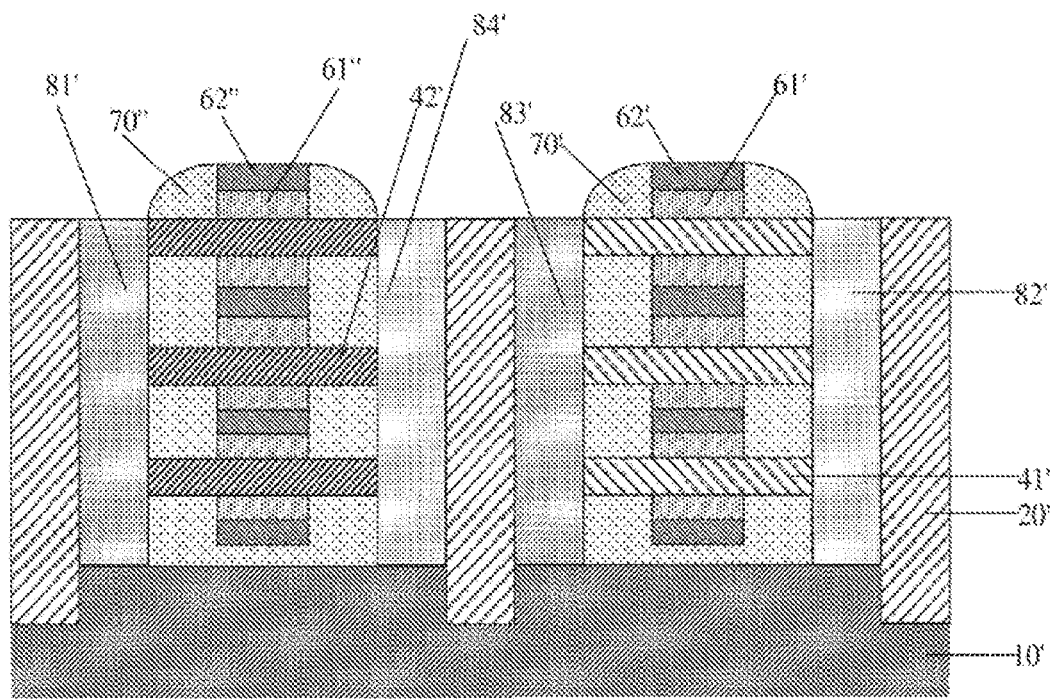

Preferably, the above manufacturing method of a field-effect transistor with negative capacitance described above further includes the following steps: forming a dummy gate stack in the NMOSFET and PMOSFET regions, surrounding the dummy gate stack, there are a gate sidewall, P+ (PMOSFET) or N+ (NMOSFET) source and drain regions; and the dummy gate stack is removed to expose each nanowire of the first and second arrays, respectively. Refer to FIG. 4D, in NMOSFET region, 81' and 84' are the N+ source region and drain region, which are located on both sides of the first nanowire array 42'. And dummy gate stack 60" consist of 61" and 62" which is wrapped on each of nanowires within the first array, 70" is a gate sidewall surrounding the dummy gate stack 60 ". For example, the dummy gate stack 60" (not shown in the FIG. 4D) comprises a dummy gate dielectric 61" and a dummy gate conductor 62", as an example, the material of the dummy gate dielectric 61" can be silicon oxide, the material of the dummy gate conductor 62" can be polysilicon, α-Si, and etc. In PMOSFET region, 83', 82' are P+ doped source region and drain region, which are located on both sides of the second nanowire array 41', a dummy gate stack 60' (not shown in the FIG. 4D) consist of 61' and 62' which is wrapped on each of nanowires in the second array, 70' is a gate sidewall surrounding the dummy gate stack 60'. as an example, the material of the dummy gate dielectric 61' can be silicon oxide, the material of the dummy gate conductor 62' can be polysilicon, α-Si, or the like.

Figure 4E:
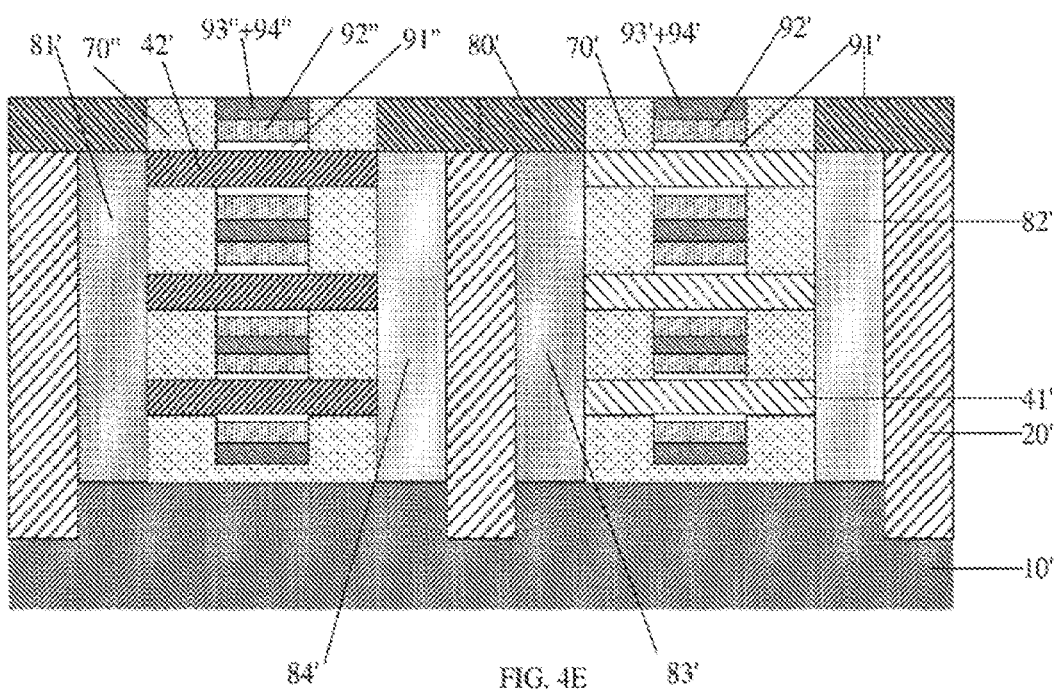

Preferably, referring to FIG. 4E, silicide regions (not shown) are formed on the surface of the source region 81', 83' and the drain region 84', 82'; an interlayer dielectric layer 80' is formed, which covers the source regions 81', 83' and the drain region 84', 82', the surface of the gate sidewall 70' and 70", and the dummy gate stack 60', 60"; CMP the interlayer dielectric layer 80' to expose the top surface of the dummy gate stack 60', 60", so that the dummy gate stack 60', 60" can be removed to expose each nanowire of the first array and the second array.

For example, when the nanowires within the second array 41' is SiGe, a method for forming the source region 83' and the drain region 82' in PMOSFET region includes: performing a Si etching process on the source 83' region and the drain region 82'; and performing an over-etching process on the gate sidewall 70' in order to form a corresponding inner recess (not shown) surrounding each of the SiGe nanowires; and performing selective epitaxy of B-doped on each of the GeSi nanowires to form P+ doped source/drain regions 83'/82' of the PMOSFET.

A method for forming the source region and the drain region in PMOSFET region is herein provided comprises: performing Si etching process on the source region and the drain region after the gate sidewall is formed; performing over-etching process on the gate sidewall in order to form a corresponding inner recess (not shown) that surrounding each of the nanowires within the array; and performing selective epitaxy of P+ doped source and P+ doped drain to form corresponding P+ doped source 81' and drain regions 82' of the PMOSFET respectively. The P+ doped source and drain region will increase the hole mobility of the PMOSFET due to its lateral compressive stress on the channel. For example, when the nanowire within the array is SiGe, a selective P+ B doped SiGe source region and drain region epitaxy is performed to form a P+ B doped SiGe source region 81' and drain region 82' of the PMOSFET respectively. For another example, when the nanowire within the second array is Si, a selective epitaxy of P+ B doped Si source and drain is performed to form a P+B doped Si source region 81' and drain region 82' of the PMOSFET respectively.

Figure 2C:
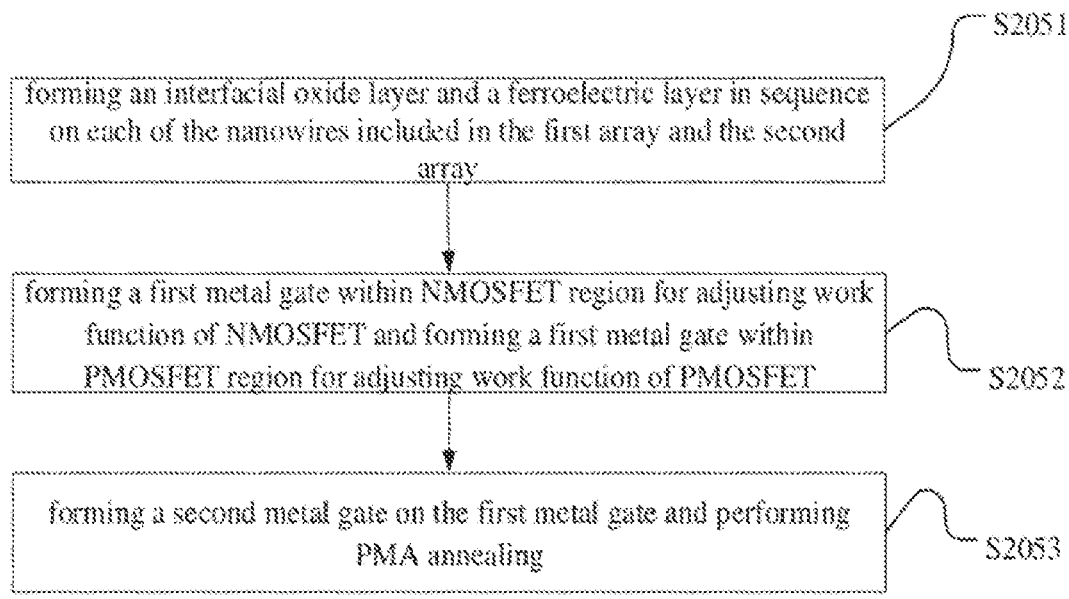
FIG. 2C is a flow chart of a method for forming the interfacial oxide layer, the ferroelectric layer, and the stacked metal gate in accordance with the embodiment as described in FIG. 2.

As shown in step S205, an interfacial oxide layer, a ferroelectric layer and a stacked metal gate are sequentially formed around each of the nanowires within the first array and second array. Refer to FIG. 2C, a method for forming the interfacial oxide layer, the ferroelectric layer and the stacked metal gate are sequentially formed around each of the nanowires comprises: step 2051, forming an interfacial oxide layer and a ferroelectric layer are sequentially formed around each of the nanowires within the first array and second array; Step 2052, forming a first metal gate on the ferroelectric layer within the NMOSFET region for adjusting work function of NMOSFET and forming a first metal gate on the ferroelectric layer within the PMOSFET region for adjusting work function of PMOSFET; step 2053, forming a second metal gate on the first metal gate and performing PMA annealing.

There are various ways to deposit the interface oxide layer, including but not limited to: rapid thermal oxidation, chemical oxidation, and O3 oxidation, etc. There are various ways to deposit the ferroelectric layer, the first metal gate or the second metal gate, including but not limited to: Physical Vapor Deposition (PVD), Plasma Enhanced Chemical Vapor Deposition (PECVD), Metal Organic Chemical Vapor Deposition (MOCVD), Atomic Layer Deposition (ALD) or the like. Refer to FIG. 4E, in PMOSFET region, the cross-sectional view of the transistor, the interfacial oxide layer 91' is deposited on each of nanowires within the second array, the ferroelectric layer 92' is deposited on the interfacial oxide layer 91', while in NMOSFET region, the interfacial oxide layer 91" is deposited on each of nanowires within the first array, the ferroelectric layer 92" is deposited on the interfacial oxide layer 91".

In this embodiment, the interfacial oxide layer 91', 91" is selected from a group consisting of SiO2, SiON, HfO2, ZrO2, Al2O3, AlN, HfSiO, HfSiON, HfAlON, Y2O3, La2O3 or HfLaON. The ferroelectric layer 92' or the ferroelectric layer 92" can be doped Hf-based oxide, the doped Hf-based oxide can be one or more of HfZrO, HfZrAlO, HfAlO, HfSiO, HfLaO, HfSrO, HfGdO and HfYO, the ferroelectric property strength of the ferroelectric layer is related to the type and content of doping elements. the content of doping elements therein, as a preferable example, optimized percentage ranges of Zr, Si, Y, Al, Gd, Sr and La contents are 30-60%, 3-6%, 4-6.5%, 3.5-6.5%, 1.5-4%, 8-12%, and 2-5% respectively.

For example, when the ferroelectric gate layer 92' or 92" is of HfZrO material, Zr content in the HfZrO material is large and the selectable interval is also large. In HfZrO, when Hf:Zr is 1:1, and the ferroelectricity is the best. When Hf:Zr>1, it will show para-electricity with the increasing of Hf content. When Hf:Zr<1, it will show anti-ferroelectricity with the increasing of Zr content. HfZrO material has a larger Zr content selection interval, which makes the manufacturing process have a larger process window and is easier to control. Generally, HfZrO adopts rapid thermal annealing at 400° C.-550° C. under the action of external electrode clamping to form good ferroelectricity, which is in line with mainstream technology of advanced semiconductor industry at present, namely compatible with the high-k/metal gate-last integration process, to avoid the influence of source-drain high temperature annealing process on CMOS device performance, so that good performance on negative-capacitance characteristics can be achieved.

For another example, when the ferroelectric gate dielectric layer 92' or 92" is HfAlO or HfSiO, Al and Si are commonly used materials in the MOSFET manufacturing processes and have good compatibility with standard CMOS processes. HfAlO or HfSiO can achieve good ferroelectricity after treated by a high temperature annealing process at 800° C.-1000° C. under the action of external electrode clamping; HfAlO and HfSiO ferroelectric materials can withstand high temperature processes and help to improve reliability of gate dielectric.

For another example, when the ferroelectric gate dielectric layer 92' or 92" is HfLaO, its residual polarization strength is large, the dielectric constant is high and the leakage is small.

In step S2052, a first metal gate layer is formed on the ferroelectric gate dielectric layer within PMOSFET and NMOSFET to adjust work function of PMOSFET and NMOSFET respectively. In one embodiment, a method for forming the first metal gate within the NMOSFET region and the first metal gate within PMOSFET region comprises: forming a first metal gate on the ferroelectric gate dielectric layer within NMOSFET region; and adjusting work function of NMOSFET by doping isotropic plasma N-type dopant ions in the first metal gate within NMOSFET region. Preferably, the dopant ions can only distribute in the first metal gate layer 93"; and forming a first metal gate on the ferroelectric layer within PMOSFET region; and adjusting work function of PMOSFET by doping isotropic plasma P-type dopant ions in the first metal gate within PMOSFET region. Preferably, the dopant ions can only distribute in the first metal gate layer 93'.

For example, the energy of the plasma can be adjusted to control the dopant ions only to distribute in the first metal layer 93' or 93". In addition, the doping amount can be calculated according to a desired threshold voltage of NMOSFET or PMOSFET. For example, the N-type dopant can be one or more of a hydride of phosphorus, fluoride of phosphorus, hydride of arsenic or fluorine of arsenic, which can be, but is not limited to selected from the group consisting of phosphane, arsenane, phosphorus pentafluoride, phosphorus trifluoride, Arsenic pentafluoride or arsenic trifluoride; the P-type dopant comprises: hydrides, fluorides or chlorides of boron, which can be, but not limited to be selected from a group consisting of B2H6, B4H10, B6H10, B10H14, B18H22, BF3 and BCl3.

In another embodiment, the work function of CMOSFET can be adjusted through the use of dual work function metal gate process for depositing a first metal gate layer. Another method for forming the first metal gate within the NMOSFET region and the first metal gate within PMOSFET region comprises: a first metal gate within NMOSFET region can be formed by N-type metal gate work function process, wherein N-type work function metal can reduce the work function of MOSFET; a first metal gate within PMOSFET region be formed by P-type metal gate work function process, wherein P-type work function metal can increase the work function of PMOSFET. For example, the first metal gate within NMOSFET region which can be one or a combination of Al, Ta, Ti, Zr, Nb, Hf, TiAl, TiAlC, TaN, TaC, TaAlC and TaAl; the first metal gate within PMOSFET region which can be one or a combination of Pt, Ni, Ir, Re, Mo, Co, TiN, TiNC, MoN, and WN.

In step S2053, forming a second metal gate on the first metal gate within NMOSFET region and forming a second metal gate on the first metal gate within PMOSFET region and performing PMA annealing. In one embodiment, a second metal gate 94' can be formed on the first metal gate 93' and covers the first metal gate 93' to fill the gate openings; a second metal gate 94" can be formed on the first metal gate 93" and covers the first metal gate 93" to fill the gate openings; and PMA annealing process is performed. Therefore, on one hand, dipoles at the interface are formed to adjust the effective work function of transistor; on the other hand, the ferroelectric negative capacitance effect is induced due to the clamping of the metal electrodes in the PMA annealing process. For example, the PMA annealing is performed at the temperature between 350° C. and 950° C., lasting for 20 seconds to 40 seconds range. Annealing can be performed by RTA annealing, Spike annealing or laser annealing, which depends on the thermal properties of the ferroelectric material.

For example, a second metal gate 94 comprises a multiple layer of metal materials, wherein a metal layer with good oxygen absorption performance adjacent to the first metal gate can be one of Ti, TiAl, and Ta, then a barrier metal layer adjacent to the metal layer with good oxygen absorption performance can be one or more of TiN, TaN, Ta, MoN, AlN and WN, finally, a filling metal layer next to the barrier metal layer can be one or more of W, Al, TiAl, TiAlC and Mo.

In present disclosure, preferably, the thickness of the interfacial oxide layer 91 is between 0.5 and 1.5 nm; the thickness of the ferroelectric layer is between 1 nm and 10 nm, and is preferably between 1 nm and 5 nm; the thickness of the first metal gate 93 is between 1 nm and 10 nm. The gate dielectric using a ferroelectric layer with smaller thickness has a larger gate capacitance, thereby the channel can be better controlled by the gate, and a better electrical performance can be achieved.

FIG. 4E is a cross-sectional view of a transistor. The interfacial layer, the ferroelectric layer, and the stacked metal gate sequentially formed at the respective gate openings of the MOSFET region taken along an axial direction of the nanowires. Referring to FIG. 4E, in a PMOSFET region, the interfacial layer 91', the ferroelectric layer 92', and the stacked metal gate (93'+94') are sequentially wrapped on the each nanowire within the second array. In an NMOSFET region, the interfacial layer 91", the ferroelectric layer 92", and the stacked metal gate (93"+94") are sequentially wrapped on each nanowire within the first array, and the second metal gate layer 94' and 94" filling the gate opening also.

There are various ways to deposit the metal layer, including a first metal gate layer and/or a second metal gate layer, which is including but not limited to: Physical Vapor Deposition (PVD), Plasma Enhanced Chemical Vapor Deposition (PECVD), Metal Organic Chemical Vapor Deposition (MOCVD), Atomic Layer Deposition (ALD), or the like. Different film stress can be obtained by optimizing deposition process parameters, comprising film thickness, deposition power, gas flow rate, composition of film, and etc. For example, when a TiNx film is deposited by a PVD process, different process parameters can be used to obtain compressive stresses of −2.5 to −8 GPa. For example, when the thickness of the TiNx film is 10 nm and the sputtering power is 600 W, experiments show that the TiNx film compressive stress increases rapidly from −3.2 GPa to −6 GPa as the N2 flow rate increases from 2.0 SCCM to 6.0 SCCM, the film compressive stress is reduced by 2 GPa as the N2 flow rate increases from 10 SCCM to 20 SCCM. The N2 flow rate should be controlled between 6 SCCM-10 SCCM to obtain the highest compressive stress TiNx film.

At last, forming contact and interconnection, the above-mentioned transistor (CMOSFET) with negative capacitance effect is completed.

The gate dielectric implemented by a thin ferroelectric film has a larger gate capacitance, so that the channel is better controlled by the gate, and better electrical performance can be achieved. The mainstream process of CMOSFET at present uses a full HK/MG gate-last integration process, which has requirements and limitations on the thickness of each functional layer. For different technology generations, gate trench widths (corresponding to gate lengths) are different, and a different width of gate trench requires a different thickness of the ferroelectric gate dielectric layer. Such as for advanced technology of 22 nm node, generally, the width of gate trench is required to be no more than 25 nm, and the thickness of the ferroelectric gate dielectric layer is required to be no more than 3 nm, which can meet the advanced process requirements of the 22 nm technology generation. With the scaling of dimension in technology generations, the width of gate trench is required to be smaller and smaller, so that the thickness of the ferroelectric gate dielectric layer has to be thinner and thinner to reach a 2-nm level and even a 1-nm level.

In an exemplary embodiment of the present disclosure, another transistor with negative capacitance and adopting the gate-all-around process is provided, and can be manufactured by the method described in the present disclosure, referring to FIG. 4E, the transistor with the negative capacitance comprises: a substrate 10'; an NMOSFET region and a PMOSFET region formed on the substrate 10' whose are separated by a shallow trench isolation region 20'; a first array of nanowires 42' within the NMOSFET region and a second array of nanowires 41' within the PMOSFET region; a source region 81' and drain region 84' which are at the both sides of the first array of nanowires 42' in the NMOSFET region; a source region 83' and drain region 82' which are at the both sides of the second array of nanowires 41' in the PMOSFET region; an interface oxide layer 91", a ferroelectric layer 92" and a stacked metal gate consists of a first metal gate 93" and a second metal gate 94" sequentially wrapped on each of the nanowires within the first array 42'; an interfacial oxide layer 91', a ferroelectric layer 92' and a stacked metal gate consists of a first metal gate 93' and a second metal gate 94' sequentially wrapped on each of the nanowires within the second array 41'; a gate sidewall 70" which surrounding the interface oxide layer 91", the ferroelectric layer 92" and the stacked metal gate consists of a first metal gate 93" and a second metal gate 94"; and a gate sidewall 70', which surrounding the interfacial oxide layer 91', the ferroelectric layer 92', the stacked metal gate consists of a first metal gate 93' and a second metal gate 94'.

The nanowires included in the first array 42' is selected from a group consisting of Si, III-V, II-VI, metals and its silicide, etc. The nanowires included in the second array 41' is selected from a group consisting of SiGe, Ge, Si, III-V, II-VI, metals and its silicide, etc.

In this embodiment, the interfacial oxide layer 91 can be one of SiO2, SiON, HfO2, ZrO2, Al2O3, AlN, HfSiO, HfSiON, HfAlON, Y2O3, La2O3 or HfLaON.

The ferroelectric layer 92' or 92" can be doped Hf-based oxide. The doped Hf-based oxide can be one or more of HfZrO, HfZrAlO, HfAlO, HfSiO, HfLaO, HfSrO, HfGdO and HfYO, and the corresponding ratio of doping element Zr, Si, Y, Al, Gd, Sr and La is between 30-60%, 3-6%, 4-6.5%, 3.5-6.5%, 1.5-4%, 8-12% and 2-5% respectively.

For example, when the ferroelectric layer is of HfZrO material, Zr content in the HfZrO material has a large percentage and a large selectable range also. In HfZrO, when Hf:Zr is 1:1, and the ferroelectricity is the best. When Hf:Zr>1, it will show para-electricity with the increasing of Hf content. When Hf:Zr<1, it will show anti-ferroelectricity with the increasing of Zr content. HfZrO material has a larger Zr content selection interval, which makes the manufacturing process have a larger process window and is easier to control. Generally, HfZrO adopts rapid thermal annealing at 400° C.-550° C. under the action of external electrode clamping to form good ferroelectricity, which is in line with mainstream technology of advanced semiconductor industry at present, namely compatible with the high-k/metal gate-all last integration process, to avoid the influence of source-drain high temperature annealing process on CMOS device performance, so that good performance on negative-capacitance characteristics can be achieved.

The first metal gate 93', 93" can be one or more of Ti, Al, Ta, Hf, Ru, Mo, W, TiN, TiC, TiAl, TiAlC, TiSiN, TaC, TaN, TaAlC, TaAl, TaCN, NbAlC, MoN, ZrN, WN, TiWN. The second metal gate 94" covers the first metal gate 93" to fill a gate opening, dipole at the interface is formed to adjust the effective work function of NMOSFET, while the second metal gate 94' covers the first metal gate 93' to fill a gate opening, dipole at the interface is formed to adjust the effective work function of PMOSFET; on the other hand, a clamping of metal electrodes during the PMA process induces the ferroelectric negative capacitance effect. The second metal gate 94', 94" includes a multiple of metal layers. For example, a second metal gate 94" or 94' comprises a multiple layer of metal materials, wherein a metal layer with good oxygen absorption performance adjacent to the first metal gate can be one of Ti, TiAl, and Ta, then a barrier metal layer adjacent to the metal layer with good oxygen absorption performance can be one or more of TiN, TaN, Ta, MoN, AlN and WN, finally, a filling metal layer can be one or more of W, Al, TiAl, TiAlC and Mo.

In this embodiment, preferably, the thickness of the interfacial oxide layer 91', 91" is between 0.5 and 1.5 nm; the thickness of the ferroelectric layer 92', 92" is between 1 nm and 10 nm, and is preferably between 1 nm and 5 nm; the thickness of the first metal gate 93", 93" is between 1 nm and 10 nm. The gate dielectric using a ferroelectric layer with smaller thickness has a larger gate capacitance, thereby the channel can be better controlled by the gate, and a better electrical performance can be achieved.

Besides adjusting the work function, the first metal gate also introduces stress to the ferroelectric gate dielectric layer, and the integrated work function and stress can be optimized according to device requirements. The stress applied to the ferroelectric gate dielectric layer can be adjusted by adjusting the thickness, formation process, and composition of the first metal gate.

The second metal gate can effectively reduce the electrode contact resistance, and may also introduce stress to the ferroelectric gate dielectric layer, and non-ferroelectricity of the ferroelectric gate dielectric layer can be transformed to ferroelectricity by a rapid thermal annealing process under the action of external electrode clamping. Therefore, the stress applied on the ferroelectric gate dielectric layer can be adjusted by changing the thickness, formation process and composition of the second metal gate layer, and the ferroelectricity of the ferroelectric gate dielectric layer can be optimized in this way.

What is claimed is:

1. A method for manufacturing a field-effect transistor, comprising:

forming an NMOSFET region and a PMOSFET region on a substrate, wherein the NMOSFET region and the PMOSFET region are separated by shallow trench isolation; and forming a hard mask on the NMOSFET region and the PMOSFET region, and patterning through the hard mask; and forming a multiple of stacked nanowires in the NMOSFET region and a multiple of stacked nanowires in the PMOSFET region by:

performing repeated alternating anisotropic and isotropic plasma etching in the NMOSFET region and the PMOSFET region; and forming a passivation film by oxidizing the surface of each of the exposed nanowires by plasma after each step of etching, wherein the passivation film has a portion located on the surface of the substrate in the NMOSFET region and the PMOSFET region and the portion is removed by anisotropic plasma to facilitate the subsequent etching; and processing the multiple of stacked nanowires in the NMOSFET region to form a first array of nanowires in the NMOSFET region and processing the multiple of stacked nanowires in the PMOSFET region to form a second array of nanowires in the PMOSFET region; and forming an interfacial oxide layer, a ferroelectric layer, and a stacked metal gate in sequence around each of the nanowires included in the first array and the second array.

2. The method according to claim 1, wherein the first array or the second array of nanowires is formed with a method comprising:

forming a sacrificial oxide layer around each of the stacked nanowires for adjusting the size and shape of the stacked nanowires; and removing the sacrificial oxide layer.

3. The method according to claim 1, wherein the second array of nanowires is formed with a method comprising:

forming a sacrificial oxide layer on each of the stacked nanowires for adjusting the size and shape of the stacked nanowires and removing the sacrificial oxide layer to obtain a pre-array of nanowires;

performing a selective epitaxial growth of SiGe film around each of the nanowires included in the pre-array;

performing a process of concentrating and oxidizing; and removing a SiO2 film formed by the process of concentrating and oxidizing in order to form the second array of nanowires.

4. The method according to claim 3, wherein the process of concentrating and oxidizing is performed at a temperature between 750° C. and 900° C., lasting for a time between 8 hours and 15 hours, and a thickness of the epitaxial SiGe film is between 5 nm and 20 nm.

5. The method according to claim 1, wherein the method further comprises:
   forming a dummy gate stack, a gate sidewall surrounding the dummy gate stack, a source region and a drain region in each of the NMOSFET region and the PMOSFET region; and
   removing the dummy gate stack in the NMOSFET region to expose each of the nanowires included in the first array and removing the dummy gate stack in the PMOSFET region to expose each of the nanowires included in second array.

6. The method according to claim 5, wherein the source region and the drain region in the PMOSFET region are formed by a method comprising:
   performing etching process on the source region and the drain region;
   performing etching process on the gate sidewall in order to form a corresponding inner recess surrounding each of the nanowires within the second array; and
   performing selective P+ epitaxy to form the P+ doped source region and the P+ doped drain region in the PMOSFET region.

7. The method according to claim 5, wherein the method further comprises:
   forming a silicide region on the surface of each one of the source regions and the drain regions within the NMOSFET region and the PMOSFET region;
   forming an interlayer dielectric layer for overlying the source region, the drain region, the surface of the gate sidewall and the dummy gate stack within each one of the NMOSFET region and the PMOSFET region; and
   polishing the surface of the interlayer dielectric layer to correspondingly expose the dummy gate stack within each one of the NMOSFET region and the PMOSFET region.

8. The method according to claim 7, wherein the method further comprises:
   forming a dummy gate stack, a gate sidewall surrounding the dummy gate stack, a source region and a drain region in the MOSFET region; and
   removing the dummy gate stack to expose each of the nanowires included in the array of nanowires.

9. The method according to claim 8, wherein the source region and the drain region are formed with a method comprising:
   performing etching process on the source region and the drain region;
   performing etching process on the gate sidewall in order to form a corresponding inner recess surrounding each of the nanowires within the array; and
   performing selective P+ epitaxy to form the corresponding P+ doped source region and the P+ doped drain region.

10. The method according to claim 1, wherein the stacked metal gate is formed with a method comprising:
    forming first metal gates on the ferroelectric layer, wherein one of the first metal gates is located within the NMOSFET region for adjusting work function of NMOSFET and another one the first metal gate is located within the PMOSFET region for adjusting work function of PMOSFET;
    forming a second metal gate on each of the first metal gates; and
    performing PMA annealing, wherein the PMA annealing is performed at a temperature between 350° C. and 950° C., lasting for 20 seconds and 40 seconds.

11. The method according to claim 10, wherein the first metal gate within NMOSFET region and the first metal gate within PMOSFET are formed by a method comprising:
    forming the first metal gate on the ferroelectric layer within the NMOSFET region and adjusting work function of the NMOSFET by doping isotropic plasma-doped N-type dopant ions in the first metal gate within the NMOSFET region; and
    forming the first metal gate on the ferroelectric layer within the PMOSFET region and adjusting work function of the PMOSFET by doping isotropic plasma-doped P-type dopant ions in the first metal gate within the PMOSFET region.

12. The method according to claim 10, wherein the first metal gate within the NMOSFET region and the first metal gate within the PMOSFET region are formed by dual metal gate work function process, wherein the first metal gate within the NMOSFET region is one or a combination of Al, Ta, Ti, Zr, Nb, Hf, TiAl, TiAlC, TaN, TaC, TaAlC and TaAl, and wherein the first metal gate within the PMOSFET region is one or a combination of Pt, Ni, Ir, Re, Mo, Co, TiN, TiNC, MoN, and WN.

13. The method according to claim 1, wherein the anisotropic plasma is one or more of HBr, Cl2, O2 and He, and an energy of the anisotropic plasma etching is between 150 W and 500 W; and wherein the isotropic plasma is one or more of SF6 and He, and an energy of the isotropic plasma etching is between 200 W and 800 W.

14. The method according to claim 13, wherein,
    the anisotropic plasma etching gas comprises HBr, Cl2, O2, wherein a ratio of Cl2:HBr is between 1:1 and 1:5, and the additive is O2; and wherein the isotropic plasma etching gas comprises SF6, He, wherein a ratio of SF6:He is between 1:3 and 1:20.

15. The method according to claim 1, wherein a thickness of the interfacial oxide layer is between 0.5 nm and 1.5 nm, a thickness of the ferroelectric layer is between 1 nm and 10 nm, and a thickness of each of the first metal gate is between 1 nm and 10 nm.

16. The method according to claim 1, wherein the ferroelectric layer is a doped Hf-based oxide, and wherein the doped Hf-based oxide has one or more component of HfZrO, HfZrAlO, HfAlO, HfSiO, HfLaO, HfSrO, HfGdO and HfYO, and corresponding ratios of doping element Zr, Si, Y, Al, Gd, Sr and La are between 30-60%, 3-6%, 4-6.5%, 3.5-6.5%, 1.5-4%, 8-12% and 2-5%, respectively.

17. A method for manufacturing a transistor, comprising:
    forming a MOSFET region on a substrate;
    forming a hard mask on the MOSFET region and patterning through the hard mask;
    forming a multiple of stacked nanowires by repeated alternating anisotropic and isotropic plasma etching in the MOSFET region, wherein after each step of etching, a passivation film is formed by oxidizing the surface of each of the exposed nanowires by plasma, wherein the passivation film has a portion located on the surface of the substrate in the MOSFET region and the portion is removed by anisotropic plasma to facilitate the subsequent etching; and
    processing the multiple of stacked nanowires to form an array of nanowires in the MOSFET region; and
    sequentially forming an interfacial oxide layer, a ferroelectric layer and a stacked metal gate around each of the nanowires within the array of nanowires.

18. The method according to claim 17, wherein the array of nanowires in MOSFET region are formed with a method comprising:

forming a sacrificial oxide layer around each of the stacked nanowires for adjusting the size and shape of each of the stacked nanowires and removing the sacrificial oxide layer to obtain the array of nanowires.

19. The method according to claim 17, wherein the array of nanowires is formed with a method comprising:
    forming a sacrificial oxide layer on each of the stacked nanowires for adjusting the size and shape of the stacked nanowires;
    removing the sacrificial oxide layer to obtain a pre-array of nanowires;
    performing a selective epitaxial growth of SiGe film around each of the nanowires included in the pre-array;
    performing a process of concentrating and oxidizing;
    and removing a SiO2 film formed by the process of concentrating and oxidizing in order to form the array of nanowires.

20. The method according to claim 19, wherein the process of concentrating and oxidizing is performed at a temperature between 750° C. and 900° C., lasting for a time between 8 hours to 15 hours, wherein a thickness of the epitaxial SiGe film is between 5 nm and 20 nm.

21. The method according to claim 17, wherein the stacked metal gate is formed with a method comprising:
    forming a first metal gate on the ferroelectric layer for adjusting work function of MOSFET;
    forming a second metal gate on the first metal gate; and
    performing PMA annealing, and wherein the PMA annealing is performed at a temperature between 350° C. and 950° C., lasting for 20 seconds to 40 seconds.

22. The method according to claim 21, wherein the first metal gate is formed by a method comprising:
    forming a first metal gate on the ferroelectric layer within the MOSFET region; and
    adjusting work function of the MOSFET which is an NMOSFET by doping isotropic plasma N-type dopant in the first metal gate or adjusting work function of the MOSFET which is a PMOSFET by doping isotropic plasma P-type dopant in the first metal gate.

23. The method according to claim 21, wherein the first metal gate is formed by metal gate work function process, and wherein the first metal gate is made of one or a combination of Al, Ta, Ti, Zr, Nb, Hf, TiAl, TiAlC, TaN, TaC, TaAlC and TaAl, or made of one or a combination of Pt, Ni, Ir, Re, Mo, Co, TiN, TiNC, MoN, and WN.

24. The method according to claim 17, wherein the anisotropic plasma etching gas comprises one or more of HBr, Cl2, O2 and He, and an energy of the anisotropic plasma etching is between 150 W and 500 W; and wherein the isotropic plasma etching gas comprises one or more of SF6 and He, and an energy of the isotropic plasma etching is between 200 W and 800 W.

25. The method according to claim 24, wherein the anisotropic plasma comprises HBr, Cl2, O2, wherein the a ratio of Cl2:HBr is between 1:1 and 1:5, and the additive is O2; or wherein the isotropic plasma comprises SF6, He, wherein the a ratio of SF6:He is between 1:3 and 1:20.

26. The method according to claim 17, wherein a thickness of the interfacial oxide layer is between 0.5 nm and 1.5 nm, a thickness of the ferroelectric layer is between 1 nm and 10 nm, and a thickness of the first metal gate is between 1 nm and 10 nm.

27. The method according to claim 17, wherein the ferroelectric layer is a doped Hf-based oxide, and wherein the doped Hf-based oxide is one or more of HfZrO, HfZrAlO, HfAlO, HfSiO, HfLaO, HfSrO, HfGdO and HfYO, and corresponding ratios of doping element Zr, Si, Y, Al, Gd, Sr and La are between 30-60%, 3-6%, 4-6.5%, 3.5-6.5%, 1.5-4%, 8-12% and 2-5%, respectively.

28. The method according to claim 17, further comprising:
    forming a silicide region on the surface of each one of the source region and the drain region;
    forming an interlayer dielectric layer for overlying the source region, the drain region, the surface of the gate sidewall and the dummy gate stack; and
    polishing the surface of the interlayer dielectric layer to expose the dummy gate stack.

\* \* \* \* \*